(12) United States Patent
Golda et al.

(10) Patent No.: US 9,314,930 B2
(45) Date of Patent: *Apr. 19, 2016

(54) MICRO PICK UP ARRAY WITH INTEGRATED PIVOT MOUNT

(71) Applicant: Luxvue Technology Corporation, Santa Clara, CA (US)

(72) Inventors: Dariusz Golda, Redwood City, CA (US); John A. Higginson, Santa Clara, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 353 days.

This patent is subject to a terminal disclaimer.

(21) Appl. No.: 13/715,591

(22) Filed: Dec. 14, 2012

(65) Prior Publication Data

US 2014/0169927 A1 Jun. 19, 2014

(51) Int. Cl.
*B23P 19/00* (2006.01)
*B25J 15/00* (2006.01)
*B25J 7/00* (2006.01)
*B81C 99/00* (2010.01)
*H01L 23/00* (2006.01)

(52) U.S. Cl.
CPC .............. *B25J 15/0085* (2013.01); *B25J 7/00* (2013.01); *B81C 99/002* (2013.01); *H01L 24/75* (2013.01); *H01L 2224/7598* (2013.01); *Y10T 29/53174* (2015.01)

(58) Field of Classification Search
CPC ........ B25J 15/0085; B25J 7/00; H02N 13/00; Y10T 29/53174; Y10T 29/53178; Y10T 29/53183; Y10T 29/53187; Y10T 29/53196; Y10T 29/53217

USPC .......... 29/739, 740, 741, 746, 745, 759, 760; 414/800, 751.1, 752.1, 217; 279/128; 347/159

See application file for complete search history.

(56) References Cited

U.S. PATENT DOCUMENTS 5,592,358 A 1/1997 Shamouilian et al.
5,839,187 A 11/1998 Sato et al.
5,851,664 A 12/1998 Bennett et al.

(Continued)

FOREIGN PATENT DOCUMENTS

CN 101863035 A 10/2010
JP 61-265218 A 11/1986

(Continued)

OTHER PUBLICATIONS

PCT International Search Report and Written Opinion for International Application No. PCT/US2014/016418, mailed May 27, 2014, 10 pages.

(Continued)

*Primary Examiner* — Peter DungBa Vo
*Assistant Examiner* — Azm Parvez
(74) *Attorney, Agent, or Firm* — Blakely, Sokoloff, Taylor & Zafman LLP

(57) ABSTRACT

Systems and methods for transferring a micro device from a carrier substrate include, in an embodiment, a micro pick up array structure to allow the micro pick up array to automatically align with the carrier substrate. Deflection of the micro pick up array may be detected to control further movement of the micro pick up array.

19 Claims, 32 Drawing Sheets

(56) References Cited

U.S. PATENT DOCUMENTS

| | | | |
|---|---|---|---|
| 5,888,847 | A | 3/1999 | Rostoker et al. |
| 5,903,428 | A | 5/1999 | Grimard et al. |
| 5,996,218 | A | 12/1999 | Shamouilian et al. |
| 6,071,795 | A | 6/2000 | Cheung et al. |
| 6,335,263 | B1 | 1/2002 | Cheung et al. |
| 6,403,985 | B1 | 6/2002 | Fan et al. |
| 6,420,242 | B1 | 7/2002 | Cheung et al. |
| 6,521,511 | B1 | 2/2003 | Inoue et al. |
| 6,558,109 | B2 | 5/2003 | Gibbel |
| 6,613,610 | B2 | 9/2003 | Iwafuchi et al. |
| 6,629,553 | B2 | 10/2003 | Odashima et al. |
| 6,670,038 | B2 | 12/2003 | Sun et al. |
| 6,786,390 | B2 | 9/2004 | Yang et al. |
| 6,878,607 | B2 | 4/2005 | Inoue et al. |
| 7,033,842 | B2 | 4/2006 | Haji et al. |
| 7,148,127 | B2 | 12/2006 | Oohata et al. |
| 7,208,337 | B2 | 4/2007 | Eisert et al. |
| 7,353,596 | B2 | 4/2008 | Shida et al. |
| 7,358,158 | B2 | 4/2008 | Aihara et al. |
| 7,585,703 | B2 | 9/2009 | Matsumura et al. |
| 7,723,764 | B2 | 5/2010 | Oohata et al. |
| 7,795,629 | B2 | 9/2010 | Watanabe et al. |
| 7,797,820 | B2 | 9/2010 | Shida et al. |
| 7,838,410 | B2 | 11/2010 | Hirao et al. |
| 7,880,184 | B2 | 2/2011 | Iwafuchi et al. |
| 7,884,543 | B2 | 2/2011 | Doi |
| 7,888,690 | B2 | 2/2011 | Iwafuchi et al. |
| 7,906,787 | B2 | 3/2011 | Kang |
| 7,910,945 | B2 | 3/2011 | Donofrio et al. |
| 7,927,976 | B2 | 4/2011 | Menard |
| 7,928,465 | B2 | 4/2011 | Lee et al. |
| 7,972,875 | B2 | 7/2011 | Rogers et al. |
| 7,999,454 | B2 | 8/2011 | Winters et al. |
| 8,023,248 | B2 | 9/2011 | Yonekura et al. |
| 8,234,780 | B2* | 8/2012 | Harvilchuck ....... H01L 21/6835 269/287 |
| 8,333,860 | B1 | 12/2012 | Bibl et al. |
| 8,579,412 | B2* | 11/2013 | Bibl ............... B41J 2/14233 347/49 |
| 2001/0029088 | A1 | 10/2001 | Odajima et al. |
| 2002/0076848 | A1 | 6/2002 | Spooner et al. |
| 2002/0171901 | A1 | 11/2002 | Bernstein |
| 2003/0177633 | A1 | 9/2003 | Haji et al. |
| 2005/0232728 | A1* | 10/2005 | Rice ................ H01L 21/4853 414/217 |
| 2007/0014920 | A1 | 1/2007 | Syms |
| 2007/0166134 | A1 | 7/2007 | Suzuki |
| 2007/0166851 | A1 | 7/2007 | Tran et al. |
| 2007/0261574 | A1 | 11/2007 | Kendale et al. |
| 2008/0163481 | A1 | 7/2008 | Shida et al. |
| 2009/0068774 | A1 | 3/2009 | Slater et al. |
| 2009/0314991 | A1 | 12/2009 | Cho et al. |
| 2010/0142114 | A1 | 6/2010 | Purohit et al. |
| 2010/0178139 | A1 | 7/2010 | Sundar et al. |
| 2010/0188794 | A1 | 7/2010 | Park et al. |
| 2010/0248484 | A1 | 9/2010 | Bower et al. |
| 2011/0003410 | A1 | 1/2011 | Tsay et al. |
| 2011/0109194 | A1 | 5/2011 | Hung et al. |
| 2012/0064642 | A1 | 3/2012 | Huang et al. |
| 2012/0134065 | A1 | 5/2012 | Furuya et al. |
| 2013/0126081 | A1 | 5/2013 | Hu et al. |
| 2013/0126891 | A1 | 5/2013 | Bibl et al. |
| 2013/0285086 | A1 | 10/2013 | Hu et al. |
| 2013/0300812 | A1* | 11/2013 | Bibl ................. H01L 25/0753 347/159 |
| 2014/0071580 | A1* | 3/2014 | Higginson ........... B81C 99/002 361/234 |
| 2014/0084482 | A1* | 3/2014 | Hu ................ H01L 24/06 257/774 |
| 2014/0169924 | A1* | 6/2014 | Golda ............... H01L 24/75 414/752.1 |
| 2014/0241844 | A1* | 8/2014 | Golda ............... B25J 11/00 414/751.1 |

FOREIGN PATENT DOCUMENTS

| | | |
|---|---|---|
| JP | 3406207 | 5/1999 |
| KR | 10-2001-0026858 A | 4/2001 |
| WO | WO 00-67543 A1 | 11/2000 |
| WO | WO 2008-052594 A1 | 5/2008 |
| WO | WO 2011/123285 | 10/2011 |

OTHER PUBLICATIONS

PCT International Search Report and Written Opinion for International Application No. PCT/US2013/073917, mailed Mar. 13, 2014, 12 pages.

PCT International Search Report and Written Opinion for International Application No. PCT/US2013/073919, mailed Mar. 27, 2014, 13 pages.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT Chapter I International Preliminary Report on Patentability (IPER) for PCT Application No. PCT/US2013/073919, mailed Jun. 16, 2015, 10 pages.

* cited by examiner

MICRO PICK UP ARRAY WITH INTEGRATED PIVOT MOUNT

BACKGROUND

1. Field

The present invention relates to micro devices. More particularly, embodiments of the present invention relate to systems and methods for transferring a micro device from a carrier substrate.

2. Background Information

The feasibility of commercializing miniaturized devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Manufacturing processes typically include wafer based processing and transferring techniques.

Device transferring processes include transfer from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer and bond the devices to a receiving wafer. Following transfer, the transfer wafer may be removed using techniques that include laser lift-off (LLO), grinding or polishing, and etching.

Gimbal mechanisms have been used in wafer polishing equipment to facilitate evenly polishing a wafer. For example, passive gimbal mechanisms in polishing equipment facilitate alignment of wafers with a polishing pad.

SUMMARY OF THE DESCRIPTION

A micro pick up array and methods of using the micro pick up array to transfer a micro device from a carrier substrate are disclosed. In an embodiment, a micro pick up array includes a base laterally around a pivot platform, and a beam between the pivot platform and the base. The beam may be coupled with the pivot platform at an inner pivot and coupled with the base at an outer pivot. The micro pick up array may also include an array of electrostatic transfer heads supported by the pivot platform. In an embodiment, the outer pivot may be on a base edge and the inner pivot may be on a pivot platform edge. The base edge may be orthogonal to the pivot platform edge. A second beam may be coupled with the base by a second outer pivot on a second base edge and coupled with the pivot platform by a second inner pivot on a second pivot platform edge. In an embodiment, the beam may be laterally around the pivot platform and coupled with the pivot platform at a second inner pivot and coupled with the base at a second outer pivot. The inner pivot may be across the pivot platform from the second inner pivot and the outer pivot may be across the pivot platform from the second outer pivot. In an embodiment, the inner pivots and the outer pivots may include silicon. In an embodiment, each electrostatic transfer head may include a top surface with a surface area in a range of 1 to 10,000 square micrometers.

In an embodiment, the micro pick up array may include an operating voltage source contact on the base in electrical connection with the array of electrostatic transfer heads. The micro pick up array may also include a trace placing the operating voltage source contact in electrical connection with the array of electrostatic transfer heads. The trace may run over the beam across the pivot platform from a dummy trace running over the beam.

In an embodiment, the micro pick up array may include a heating contact on the base and a heating element over the pivot platform in electrical connection with the heating contact. The micro pick up array may include a temperature sensor on the pivot platform.

A micro device transfer system and methods of using the micro device transfer system to transfer a micro device from a carrier substrate are disclosed. In an embodiment, the micro device transfer system includes a transfer head assembly having a mounting surface and a micro pick up array. The micro pick up array may include a base laterally around a pivot platform and a beam between the pivot platform and the base. The beam may be coupled with the pivot platform at an inner pivot and coupled with the base at an outer pivot. The micro pick up array may also include an array of electrostatic transfer heads supported by the pivot platform. The pivot platform may be deflectable toward the transfer head assembly when the base is mounted on the mounting surface.

In an embodiment, the micro device transfer system includes the transfer head assembly having a sensor to detect deflection of the pivot platform toward the transfer head assembly. The sensor may be a contact sensor to sense a deflected position of the pivot platform. The contact sensor may include a switch. Alternatively, the sensor may be a motion sensor to sense movement of the pivot platform.

In an embodiment, the micro device transfer system includes the transfer head assembly having an operating voltage source connection and the micro pick up array having an operating voltage source contact on the base. The operating voltage source contact may be in electrical connection with the array of electrostatic transfer heads. For example, a trace may place the operating voltage source connection in electrical connection with the array of electrostatic transfer heads.

In an embodiment, the micro device transfer system includes the transfer head assembly having a vacuum port coupled with a vacuum source to apply suction to the micro pick up array.

In an embodiment, the micro device transfer system includes the transfer head assembly having a clamp voltage source connection and the micro pick up array having a clamp voltage source contact on the base. The clamp voltage source connection may be aligned with the clamp voltage source contact to electrostatically bond the micro pick up array to the transfer head assembly when voltage is applied to the clamp voltage source connection.

In an embodiment, each electrostatic transfer head includes a top surface having a surface area in a range of 1 to 10,000 square micrometers. In an embodiment, the micro device transfer system includes a heating contact on the base and a heating element over the pivot platform in electrical connection with the heating contact. In an embodiment, the micro device transfer system includes a temperature sensor on the pivot platform.

In an embodiment, a method includes moving a transfer head assembly toward a carrier substrate and contacting an array of micro devices on the carrier substrate with an array of electrostatic transfer heads on a pivot platform of a micro pick up array having a base mounted on the transfer head assembly. The method may include deflecting the pivot platform toward the transfer head assembly, sensing deflection of the pivot platform, stopping relative movement between the transfer head assembly and the carrier substrate, applying a voltage to the array of electrostatic transfer heads to create a grip pressure on the array of micro devices, and picking up the array of micro devices from the carrier substrate.

In an embodiment, the method includes moving the transfer head assembly toward the pivot platform after sensing deflection and before stopping relative movement. In an embodiment, the method includes stopping relative movement between the transfer head assembly and the carrier substrate after sensing deflection of the pivot platform with a plurality of sensors. In an embodiment, the method includes moving the transfer head assembly toward the carrier substrate for a set distance after sensing deflection of the pivot platform. In an embodiment, the method includes stopping relative movement between the transfer head assembly and the carrier substrate immediately in response to sensing deflection of the pivot platform. In an embodiment, the method includes actuating the transfer head assembly to further align the pivot platform to a plane of the carrier substrate by tipping or tilting the transfer head assembly after sensing deflection of the pivot platform. In an embodiment, the method includes applying heat to the array of electrostatic transfer heads while picking up the array of micro devices.

In an embodiment, a method includes moving a transfer head assembly toward a receiving substrate and contacting the receiving substrate with an array of micro devices carried by an array of electrostatic transfer heads on a pivot platform of a micro pick up array. A base of the micro pick up array may be mounted on the transfer head assembly. The method may include deflecting the pivot platform toward the transfer head assembly, sensing deflection of the pivot platform, stopping relative movement between the transfer head assembly and the receiving substrate, removing a voltage from the array of electrostatic transfer heads, and releasing the array of micro devices onto the receiving substrate.

In an embodiment, the method includes moving the transfer head assembly toward the pivot platform after sensing deflection and before stopping relative movement. In an embodiment, the method includes stopping relative movement between the transfer head assembly and the receiving substrate after sensing deflection of the pivot platform with a plurality of sensors. In an embodiment, the method includes moving the transfer head assembly toward the receiving substrate for a set distance after sensing deflection of the pivot platform. In an embodiment, the method includes stopping relative movement between the transfer head assembly and the receiving substrate immediately in response to sensing deflection of the pivot platform. In an embodiment, the method includes actuating the transfer head assembly to further align the pivot platform to a plane of the receiving substrate by tipping or tilting the transfer head assembly after sensing deflection of the pivot platform. In an embodiment, the method includes applying heat to the array of micro devices before removing the voltage from the array of electrostatic transfer heads.

DETAILED DESCRIPTION

Figure 1:
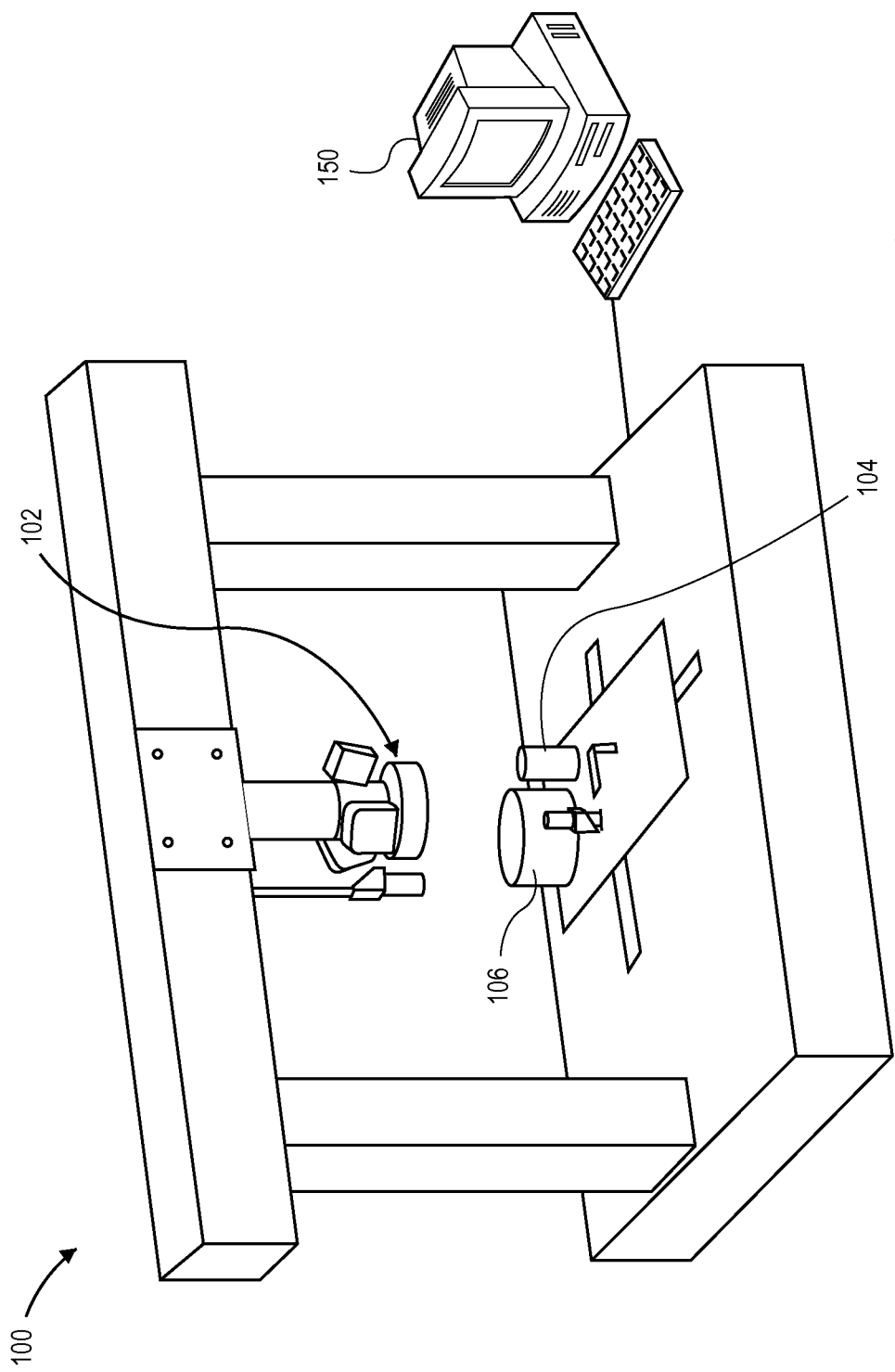
FIG. 1 is a perspective view illustration of a mass transfer tool in accordance with an embodiment of the invention.

Embodiments of the present invention describe systems and methods for transferring a micro device or an array of micro devices from a carrier substrate. For example, the micro devices or array of micro devices may be any of the micro LED device structures illustrated and described in related U.S. patent application Ser. Nos. 13/372,222, 13/436, 260, 13/458,932, and 13/625,825. While some embodiments of the present invention are described with specific regard to micro LED devices, the embodiments of the invention are not so limited and certain embodiments may also be applicable to other micro LED devices and micro devices such as diodes, transistors, ICs, and MEMS.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, embodiments of the present invention are not necessarily so limited, and certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 μm. In an embodiment, the top contact surface of each micro device or electrostatic transfer head has a maximum dimension of 1 to 100 μm. In an embodiment, the top contact surface of each micro device or electrostatic transfer head has a maximum dimension of 3 to 20 μm. In an embodiment, a pitch of an array of micro devices, and a pitch of a corresponding array of electrostatic transfer heads, is (1 to 100 μm) by (1 to 100 μm), for example, a 20 μm by 20 μm or a 5 μm by 5 μm pitch. In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip pressure on a micro device and pick up the micro device.

In one aspect, embodiments of the invention describe systems and methods for the mass transfer of micro devices using a micro pick up array with a self-aligning capability. In an embodiment, the micro pick up array may include one or more pivots and beams to allow a pivot platform to automatically align to a carrier substrate or a receiving substrate when the system components are brought into contact, e.g., when electrostatic transfer heads supported by the pivot platform contact an array of micro devices on the carrier substrate. Thus, the micro pick up array facilitates more complete and uniform contact between the array of electrostatic transfer heads and the array of micro devices being transferred. In this manner, the self-aligning capability of the micro pick up array may allow for a simpler mass transfer tool design in which an expensive arrangement of sensors (such as spectral-interference laser displacement meters) and actuators may not be required for fine-alignment of the micro pick up array with the carrier or receiving substrate on the micron or sub-micron scale prior to picking up or releasing the array of micro devices. Thus, the self-aligning capability may reduce cost of system components, while also increasing the transfer rate of micro devices since fine-alignment may be accomplished by the self-aligning capability while picking up and releasing the array of micro devices.

In another aspect, embodiments of the invention describe systems and methods for the mass transfer of micro devices using sensors to sense system component deflections. A variety of sensors may be employed such as expensive spectral-interference laser displacement meters, or less expensive sensor switches that detect contact between system components. For example, a sensor may detect deflection of a pivot platform of a micro pick up array when the micro pick up array is mounted on a transfer head assembly and an electrostatic transfer head supported by the pivot platform contacts a micro device on a carrier substrate, or a when a micro device carried by an electrostatic transfer head contacts a receiving substrate. More specifically, in an embodiment, relative movement between a transfer head assembly and a carrier substrate or receiving substrate may be stopped in response to a sensed deflection of a pivot platform. Movement may stop immediately upon detection, or upon a predetermined event following detection. Thus, contact between an array of micro devices and an array of electrostatic transfer heads or a receiving substrate may be monitored to control pick up and release of the array of micro devices.

In another aspect, embodiments of the invention describe systems and methods for the mass transfer of micro devices using system components having heating mechanisms to apply heat to an array of micro devices. In an embodiment, the heating mechanism includes a resistive heating element on a micro pick up array. Heat may thus be delivered through the micro pick up array to one or more electrostatic transfer heads, and into an array of micro devices gripped by the electrostatic transfer heads. In this manner, it is possible to transfer heat from a micro pick up array with self-aligning capability to a micro device without excessively heating portions of the micro pick up array.

In yet another aspect, embodiments of the invention describe a manner for mass transfer of an array of pre-fabricated micro devices with an array of electrostatic transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 20 μm by 20 μm pitch or a 5 μm by 5 μm pitch. At these densities a 6 inch substrate, for example, can accommodate approximately 165 million micro LED devices with a 10 μm by 10 μm pitch, or approximately 660 million micro LED devices with a 5 μm by 5 μm pitch. A transfer tool including an array of electrostatic transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of electrostatic transfer heads can pick up and transfer more than 100,000 micro devices, with larger arrays of electrostatic transfer heads being capable of transferring more micro devices.

Referring to FIG. 1, a perspective view illustration of a mass transfer tool for transferring micro devices from a carrier substrate is shown in accordance with an embodiment of the invention. Mass transfer tool 100 includes a transfer head assembly 102 for picking up a micro device from a carrier substrate held by a carrier substrate holder 104 and for transferring and releasing the micro device onto a receiving substrate held by a receiving substrate holder 106. A system of actuators operates to move the transfer head assembly 102 under the control of a computer system 150. Furthermore, computer system 150 controls the actuators based on feedback inputs from various sensors. In some embodiments, mass transfer tool 100 may be any of the mass transfer tool embodiments illustrated and described in related U.S. patent application Ser. No. 13/607,031, which is hereby incorporated by reference.

Figure 2:
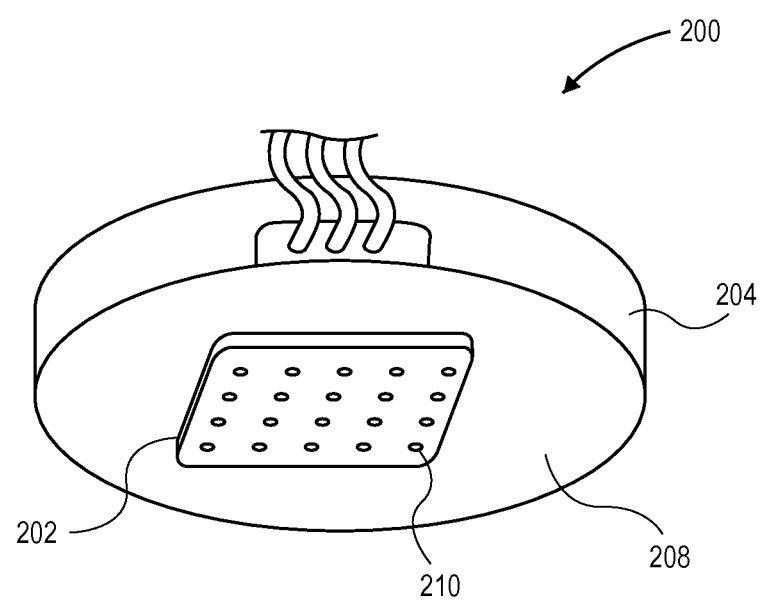
FIG. 2 is a perspective view illustration of a micro device transfer system including a transfer head assembly holding a micro pick up array in accordance with an embodiment of the invention.

Referring to FIG. 2, a perspective view illustration of a micro device transfer system including a transfer head assembly holding a micro pick up array is shown in accordance with an embodiment of the invention. Micro device transfer system 200 includes micro pick up array 202 and transfer head assembly 204. Micro pick up array 202 may be retained on a mounting surface 208 of transfer head assembly 204. Micro pick up array 202 may support one or more electrostatic transfer heads 210. In an embodiment, the components of micro pick up array system 200 may be electrically connected, such that an operating voltage path traverses the components. In an embodiment, the components of micro device transfer system 200 may be, e.g., mechanically or electrostatically joined.

Figure 3A:
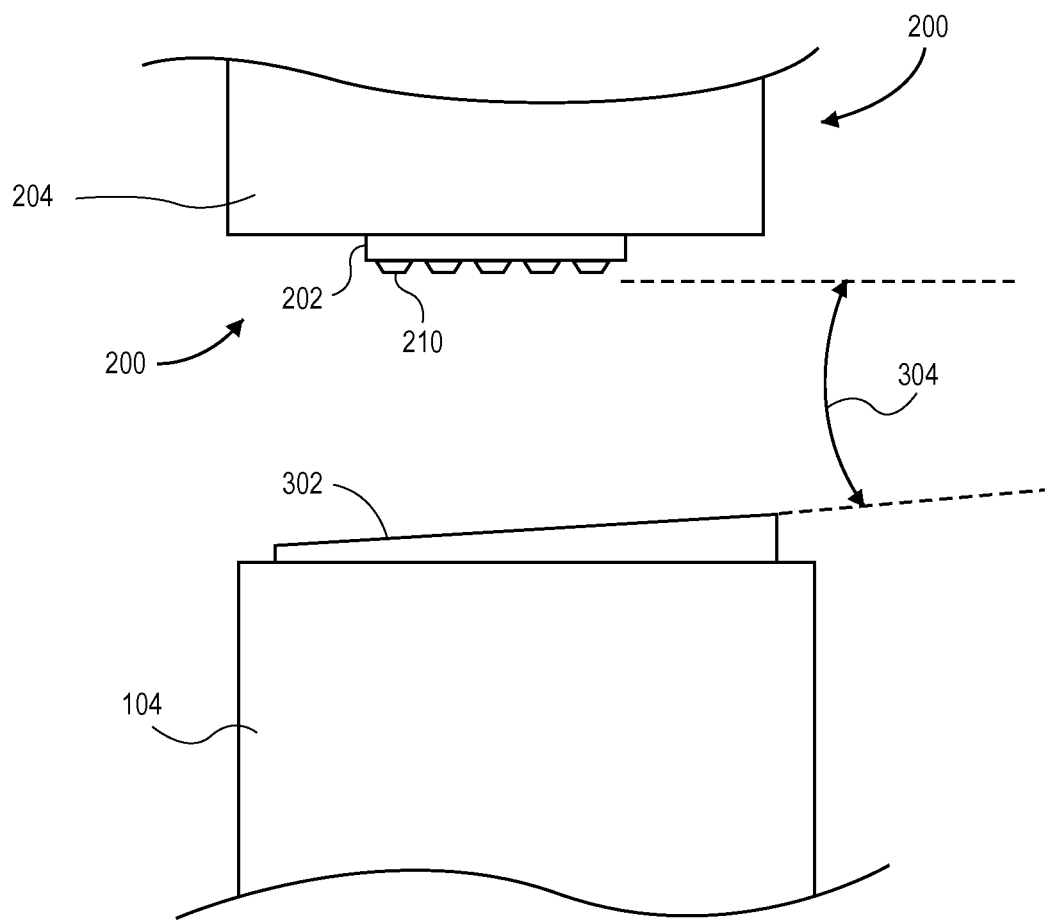
FIG. 3A is a side view illustration of a micro device transfer system having an array of electrostatic transfer heads positioned over and apart from an array of micro devices on a carrier substrate in accordance with an embodiment of the invention.

Referring to FIG. 3A, a side view illustration of a micro device transfer system having an array of electrostatic transfer heads positioned over and apart from an array of micro devices on a carrier substrate is shown in accordance with an embodiment of the invention. Micro device transfer system 200 with micro pick up array 202 supporting an array of electrostatic transfer heads 210 may be positioned over and apart from an array of micro devices (not shown) carried on carrier substrate 302, which is held by carrier substrate holder 104. In an initial state, micro pick up array 202 and carrier substrate 302 may have surfaces that are misaligned by an angle 304. Micro pick up array 202 may include a pivot platform (not shown) as described in more detail in the following description that allows for the self-alignment of micro pick up array 202 with the array of micro devices on the carrier substrate 302. More specifically, the pivot platform 404 may be able to move relative to transfer head assembly 204 to align with carrier substrate 302.

Figure 3B:
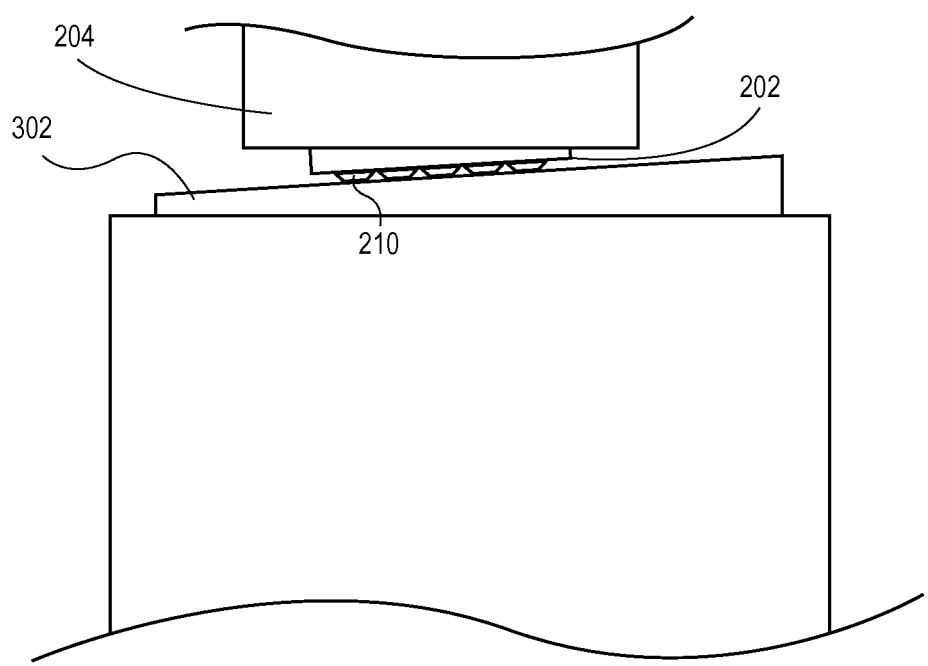
FIG. 3B is a side view illustration of a micro device transfer system having an array of electrostatic transfer heads positioned over and in contact with an array of micro devices on a carrier substrate in accordance with an embodiment of the invention.

Referring to FIG. 3B, a side view illustration of a micro device transfer system having an array of electrostatic transfer heads positioned over and in contact with an array of micro devices on a carrier substrate is shown in accordance with an embodiment of the invention. When micro pick up array 202 is moved toward carrier substrate 302 from the misaligned state shown in FIG. 3A, the array of electrostatic transfer heads 210 may contact an array of micro devices on the carrier substrate 302 unevenly. For example, one side of array of electrostatic transfer heads 210 may contact the array of micro devices while another side may not. Alternatively, all of the electrostatic transfer heads 210 may make contact, but the pressure applied throughout the array of electrostatic transfer heads 210 may be uneven. However, as described below, the forces imparted to array of electrostatic transfer heads 210 may tip and tilt the pivot platform, allowing array of electrostatic transfer heads 210 to align with the array of micro devices on carrier substrate 302. That is, the pivot platform may rotate and translate about and along multiple axes to align with the contacting surface, e.g., carrier substrate 302, such that complete and uniform contact is achieved.

Since the pivot platform self-aligns, pressure and/or contact distribution throughout micro pick up array 202 may be substantially uniform. Uniform pressure distribution can include even pressure and/or contact between the electrostatic transfer heads 210 and the micro devices on carrier substrate 302. Such uniform pressure or contact may avoid damage to electrostatic transfer heads 210 or micro devices and it may enable the contact and transfer of all, or nearly all, of the micro devices.

Figure 4A:
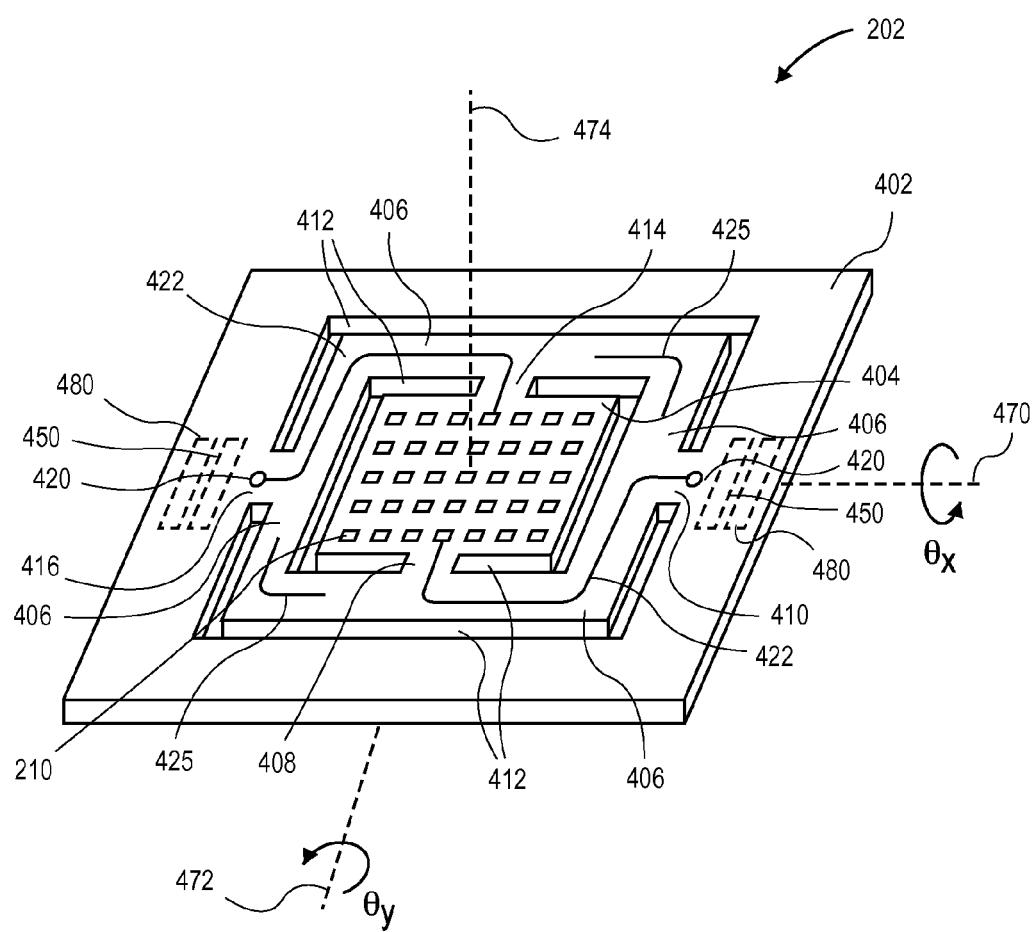
FIG. 4A is a perspective view illustration of a micro pick up array having a self-aligning pivot platform in accordance with an embodiment of the invention.

Referring now to FIG. 4A, a perspective view illustration of a micro pick up array having a self-aligning pivot platform is shown in accordance with an embodiment of the invention. Micro pick up array 202 includes base 402 and pivot platform 404. In an embodiment, base 402 surrounds all or a part of pivot platform 404. For example, base 402 may extend laterally around pivot platform 404, as illustrated. In an alternative embodiment, base 402 does not surround pivot platform 404. Base 402 and pivot platform 404 may be interconnected by one or more beams 406. Each beam 406 may connect with base 402 and pivot platform 404 at one or more pivot locations, such as inner pivots 408, 414 and outer pivots 410, 416.

FIG. 4A shows both base 402 and pivot platform 404 having rectangular perimeters, however base 402 and pivot platform 404 may be shaped differently. For example, base 402 may be circular, hexagonal, oval, etc., without departing from the scope of this disclosure. Likewise, pivot platform 404 may be alternatively shaped. For example, pivot platform 404 may be circular, hexagonal, oval, etc. In an embodiment, base 402 and pivot platform 404 have conforming shapes, such that pivot platform 404 is nestled within the base 402 of the same shape. In other embodiments, base 402 and pivot platform 404 do not have conforming shapes. For example, base 402 may be circular and pivot platform 404 may be rectangular, resulting in additional gaps near the midpoint of each side of pivot platform 404. Such mismatch may allow for the length of beams 406 within the gaps to be increased to promote pivot platform 404 self-alignment as described further below.

Still referring to FIG. 4A, pivot platform 404 may self-align to another surface by tipping, tilting, rotating, and translating from its original position relative to base 402. More specifically, pivot platform 404 and base 402 are able to move relative to each other through deflection of beams 406 and various pivots.

In at least one embodiment, the lateral extension of beam 406 provides a lever arm that allows adequate bending in beams 406 to enable relative movement between base 402 and pivot platform 404 when forces are applied to those components. For example, bending in beam 406 may facilitate tipping or tilting of pivot platform 404 in alternate planes. For example, bending of beam 406 between inner pivot 408 and outer pivot 410 may cause pivot platform 404 to tilt away from the orientation shown in FIG. 4A. Furthermore, bending of beam 406 may allow pivot platform 404 to translate in different directions, such as along an axis orthogonal to pivot platform 404, e.g., a z-direction along axis 474.

Translation of pivot platform 404 along an axis orthogonal to a surface supporting electrostatic transfer heads 210 may occur when an external load is applied to the electrostatic transfer heads 210. More specifically, when base 402 is fixed or pressed against a surface, an external load applied to pivot platform 404 may result in telescoping of micro pick up array 202 along an axis orthogonal to pivot platform 404. This telescoping may be defined by the deflection, or translation, of pivot platform 404. In an embodiment, the potential amount of deflection relates to the degree of misalignment that may be accommodated between a micro pick up array 202 and a carrier substrate 302, as will be more fully described below. Thus, in an embodiment, the range of motion of pivot platform 404 relative to base 402 along an orthogonal axis may be in a range of about 1 to 30 micrometers. In another embodiment, the range of motion may be in a range of about 2 to 10 micrometers. Even more particularly, in an embodiment, pivot platform 404 may telescope away from base 402 by approximately 10 micrometers.

In an embodiment, the pivots of micro pick up array 202 are positioned to twist about multiple axes. For example, inner pivot 408 is positioned on pivot platform 404 at an edge that is orthogonal to an edge of base 402 on which outer pivot 410 is positioned. Thus, axes such as axis 470 and axis 472 running perpendicular to the edges that inner pivot 408 and outer pivot 410 are positioned on, are also orthogonal to each other. Resultantly, pivot platform 404 and base 402 may twist relative to each other along axes 470 and 472. For example, pivot platform 404 can twist in a direction $\theta_x$ about axis 470, relative to base 402. Additionally, pivot platform 404 can twist in a direction $\theta_y$ about axis 472, relative to base 402.

Micro pick up array 202 may include pairs of pivots along an axis of torsion. For example, micro pick up array 202 may include inner pivot 414 positioned across pivot platform 404 from inner pivot 408. Thus, pivot platform 404 may be supported along opposite sides by beam 406 at inner pivots 408 and 414. Furthermore, pivot platform 404 may rotate about an axis, e.g., axis 472, running through inner pivot 408 and inner pivot 414 when a force is applied to the pivot platform 404 at a point offset from the axis. For example, pivot platform 404 may rotate in a direction $\theta_y$ about axis 472 when a force is applied to beam 406 near outer pivot 410. Likewise, micro pick up array 202 may include outer pivot 416 positioned across pivot platform 404 from outer pivot 410. Thus, the beam 406 connecting pivot platform 404 with base 402 may be supported along opposite sides by base 402 at outer pivots 410 and 416. Furthermore, pivot platform 404 may rotate about an axis, e.g., axis 470, running through outer pivot 410 and outer pivot 416 when a force is applied to the pivot platform offset from the axis. For example, pivot platform 404 may rotate in a direction $\theta_x$ about axis 470 when a force is applied to beam 406 near inner pivot 408. Thus, pivots of micro pick up array 202 facilitate movement and automatic alignment between the base 402 and pivot platform 404.

Therefore, the structure of micro pick up array 202 provides for pivot platform 404 to self-align to another surface by tipping, tilting, rotating, and translating from its original position relative to base 402. Various modifications can be used to further augment this self-aligning structure. For example, portions of beams 406 can be shaped to facilitate bending, e.g., portions of beams 406 can be narrowed compared to other portions. Alternatively, material modification, e.g., heat treatment, of areas can be used to alter or tune the stiffness of beams 406 and the various pivots. Furthermore, thicknesses of the beams 406 and the various pivots can be modified, e.g., by thinning areas though various machining or etching processes that will produce localized flexure bearings. Thus, the embodiment shown in FIG. 4A is intended to be illustrative, and not exhaustive, of the possible micro pick up array 202 structural embodiments.

In accordance with embodiments of the invention, micro pick up array 202 may be formed from one or more portions or parts. Several materials may be utilized for the micro pick up array 202. Material selection for the micro pick up array is driven by the capability to deflect under applied load, thermal stability, and minimal spring mass. Table 1 lists relevant material properties for several candidate materials including silicon, silicon carbide, aluminum nitride, stainless steel, and aluminum.

TABLE 1

| Material | Modulus (GPA) | Yield Strength (MPa) | Flexure Ratio (×10e−3) | CTE (ppm/° C.) | Density (kg/m³) |
|---|---|---|---|---|---|
| Silicon | 165 | 2000 | 12.1 | 2.6 | 2400 |
| Silicon Carbide | 410 | 550 | 1.3 | 4.0 | 3100 |
| Aluminum Nitride | 320 | 320 | 1.0 | 4.5 | 3260 |
| Stainless Steel 316 | 190 | 600 | 3.2 | 14 | 8240 |
| Aluminum | 70 | 47 | 0.7 | 23 | 2700 |

Although each of the listed materials may be used for the micro pick up array, silicon has the largest flexure ratio, lowest CTE, and lowest density of the candidate materials. In addition, silicon may be formed with a variety of precision semiconductor manufacturing techniques.

Thus, in an embodiment, base 402, pivot platform 404, and beam 406 are formed from a silicon wafer to produce distinct regions. More specifically, known processes, such as deep etching, laser cutting, etc. may be used to form channels 412. In at least one embodiment, channels 412 may therefore define the structure of micro pick up array 202 by providing separations between, e.g., base 402 and pivot platform 404 and to delineate beams 406.

Still referring to FIG. 4A, micro pick up array 202 may include one or more operating voltage source contacts 418 on base 402. Operating voltage source contacts 418 may function to transfer the operating voltage to the array of electrostatic transfer heads 210 on the micro pick up array 202 when operably connected with the transfer head assembly 204. Operating voltage may be transferred for example, through an electrical pathway between operating voltage source contacts 418 and electrostatic transfer heads 210. An electrical pathway can include various vias (not shown) and traces 422 arranged in different configurations. In an embodiment, operating voltage source contact(s) 418, vias (not shown), and traces 422 may be formed separately or simultaneously using a suitable technique such as, but not limited to, sputtering or electron beam evaporation of a conductive material (e.g., metal) onto a surface of micro pick up array 202 or into a passivated hole formed through micro pick up array 202. Similar electrical connections can be formed between one or more of the electrostatic transfer heads 210 in the array.

Micro pick up array 202 may further include an arrangement of dummy traces 425 on the same side of the micro pick up array 202 as traces 422. As illustrated in FIG. 4A, dummy traces 425 may mirror the arrangement of traces 422 on portions of beams 406 or pivot platform 404 in order to balance residual and thermal stresses in micro pick up array 202. More specifically, residual stresses from the fabrication of micro pick up array 202 depend in part on the composite structural characteristics of beams 406. Traces 422 along beams 406 contribute to these characteristics, and residual stresses caused by, e.g., the cooling of beams 406 during fabrication, may therefore be different in beams 406 having traces 422 than beams 406 without traces 422. This difference may result in, e.g., skewing of the self-aligning structure at ambient conditions. Alternatively, or in conjunction with these residual stresses, when heat is applied to micro pick up array 202, beams 406 with traces 422 may behave differently, e.g., expand at a different rate, than beams 406 without traces 422. Again, this may distort the micro pick up array structure. Dummy traces 425 give beams 406 without traces 424 similar composite structural characteristics as beams 406 with traces 422. Thus, dummy traces 425 can balance or offset residual and thermal stresses throughout all of the beams 406 to avoid distortion of micro pick up array 202.

Figure 4B:
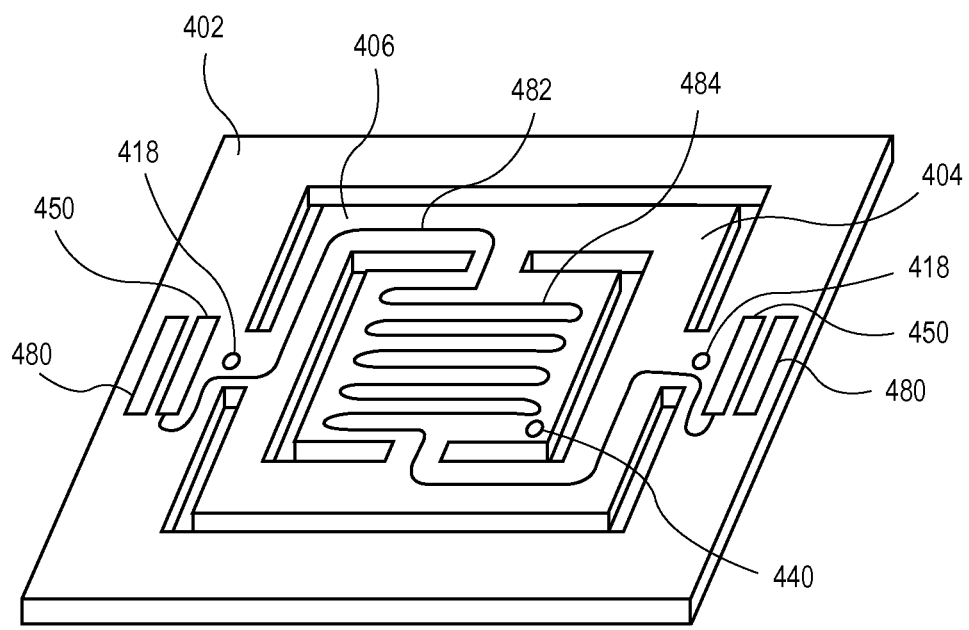
FIG. 4B is a perspective view illustration of a micro pick up array having a self-aligning pivot platform in accordance with an embodiment of the invention.

Referring now to FIG. 4B, a perspective view illustration of a micro pick up array having a self-aligning pivot platform is shown in accordance with an embodiment of the invention. In some embodiments, micro pick up array 202 may include heating contact 480 placed on base 402. For example, heating contact 480 can be adjacent to clamp area 450 on the bottom surface of micro pick up array 202 to align with or otherwise be placed in electrical connection with a heating connection 970 (FIGS. 9A-9C) of transfer head assembly 206. Multiple heating contacts 480 may be used, for example, to pass current through one or more heating elements 484. More specifically, heating element 484 may extend from a first heating contact 480 and over pivot platform 404 and/or beams 406 before terminating at, e.g., a second heating contact 480. Thus, heating element 484 can carry electrical current between multiple heating contacts 480. As current passes through heating element 484, Joule heating causes the temperature of heating element 484 to rise.

In an embodiment, heating element 484 may be connected with heating contacts 480 by one or more heating leads 482. Heating lead 482 can be sized and configured to dissipate less heat than heating element 484, and thus, act as an electrical lead to carry electrical current from heating contacts 480 over portions of micro pick up array 202, e.g., base 402 and beams 406, without heating those portions significantly. For example, heating lead 482 may be a copper conductor. In this manner, heating of micro pick up array 202 can be isolated to areas having heating element 484, such as pivot platform 404.

Heating element 484 may be formed from a material and shape that is conducive to resistive heating. More particularly, heating element 484 can be formed to generate heat when an electrical current is passed through it. As an example, heating element 484 can be formed from a wire strand of molybdenum disilicide. The wire strand can be coiled or sinuously placed on the micro pick up array 202 to uniformly distribute heat across or throughout a surface or structure, e.g., pivot platform 404. Heating element 484 may be insulated, for example by laminating over the element, to protect adjacent components from excessive heating and to direct heat into pivot platform 404. Heating element 484 may be insulated, for example by laminating over the element, to protect adjacent components from excessive heating and to direct heat into pivot platform 404.

In an embodiment, micro pick up array 202 includes a temperature sensor to sense the temperature of micro pick up array 202. For example, temperature sensor 440 may be located on a corner of the pivot platform to measure the temperature of the pivot platform 404. Temperature sensor 440 may be potted or otherwise adhered or mechanically fixed to the pivot platform 404. In another embodiment, temperature sensor 440 may be located in a center of pivot platform 404, or on base 402 or beam 406. In still other embodiments, temperature sensor 440 can be located on a front or back surface of pivot platform 404, i.e., on a surface having electrostatic transfer heads 210 or on an opposite surface having operating voltage source contacts 418. The choice of location can be driven by considerations such as available space and whether the temperature sensor 440 will interfere with other functions, such as whether it will disrupt electrical charge in the electrostatic transfer heads 210. For example, in an embodiment, temperature sensor 440 may be centered on the back surface of pivot platform 404 where the sensor may closely approximate the peak temperature of micro pickup array 202. Temperature variations due to convective heat loss may skew the measured temperature if sensor 440 is located in close proximity to the edge of pivot platform 404. Temperature sensor 440 may be any of a variety of known temperature sensors, such as junction-type thermocouples, resistance temperature detectors, etc. Furthermore, temperature sensor 440 can be monitored through electrical connections such as vias and traces (not shown) similar to those described above.

Figure 4C:
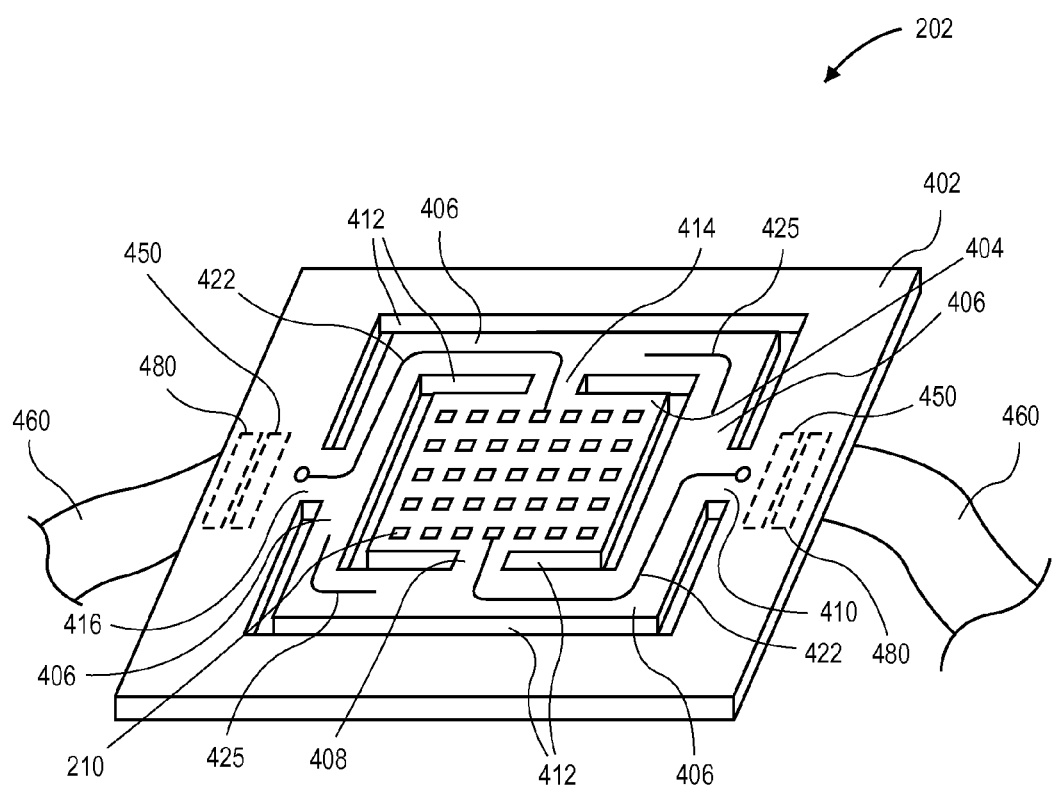
FIG. 4C is a perspective view illustration of a micro pick up array having a self-aligning pivot platform in accordance with an embodiment of the invention.

Referring to FIG. 4C, a perspective view illustration of a micro pick up array having a self-aligning pivot platform is shown in accordance with an embodiment of the invention. By contrast to the embodiment shown in FIG. 4A, micro pick up array 202 may include ribbon cables 460 having wires to make electrical connection between micro pick up array 202 and the transfer head assembly 204. Ribbon cables 460 can be engaged with an insulation-displacement connector in electrical connection with contacts located on an opposite side of micro pick up array 202 as electrostatic transfer heads 210, as illustrated in FIG. 5B. Therefore, operating voltage can be applied to electrostatic transfer heads 210 through various electrical pathways connecting the electrostatic transfer heads 210 with ribbon cable 460. Similarly, electrical current can be supplied to heating contacts 480 through ribbon cable 460. For example, vias and traces may interconnect ribbon cable 460 with electrostatic transfer heads 210. Ribbon cable 460 can also be in electrical communication with an external component, such as transfer head assembly 204. More specifically, transfer head assembly 204 may have an electrostatic voltage source to supply operating voltage to ribbon cables 460 and the operating voltage may therefore be conveyed to micro pick up array 202. Similarly, transfer head assembly 204 may have a heating current source to supply electrical current to ribbon cables 460 and the heating current may therefore be conveyed to micro pick up array 202.

Figure 4D:
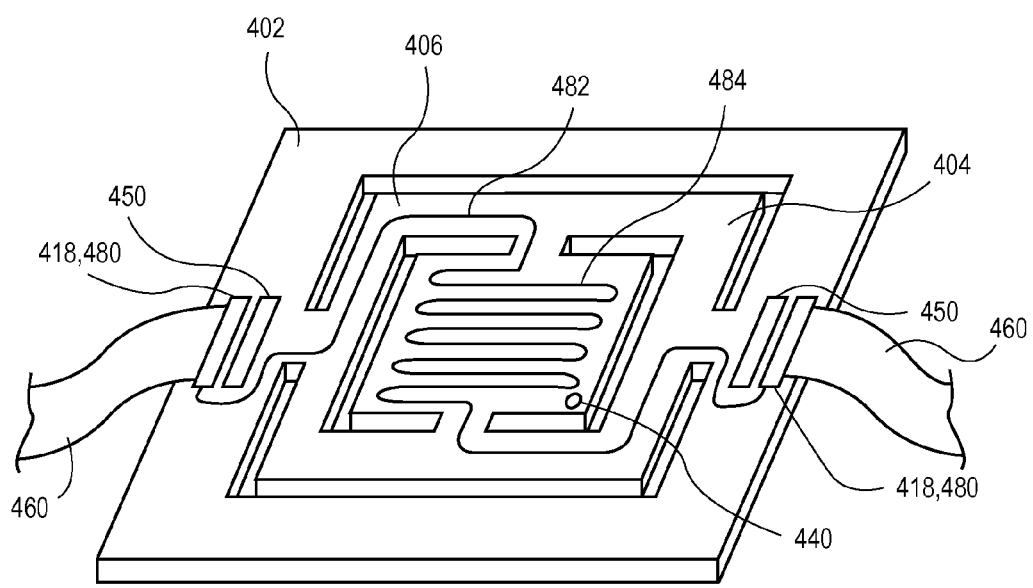
FIG. 4D is a perspective view illustration of a micro pick up array having a self-aligning pivot platform in accordance with an embodiment of the invention.

Referring now to FIG. 4D, a perspective view illustration of a micro pick up array having a self-aligning pivot platform is shown in accordance with an embodiment of the invention. In an embodiment, clamp areas 450 and heating contacts 480 may be placed on a micro pick up array 202 on a bottom surface of base 402, opposite from electrostatic transfer heads 210. Thus, heat can be delivered from heating element 484 through pivot platform 404 to the top surface of micro pick up array 202 having electrostatic transfer heads 210.

Figure 5A:
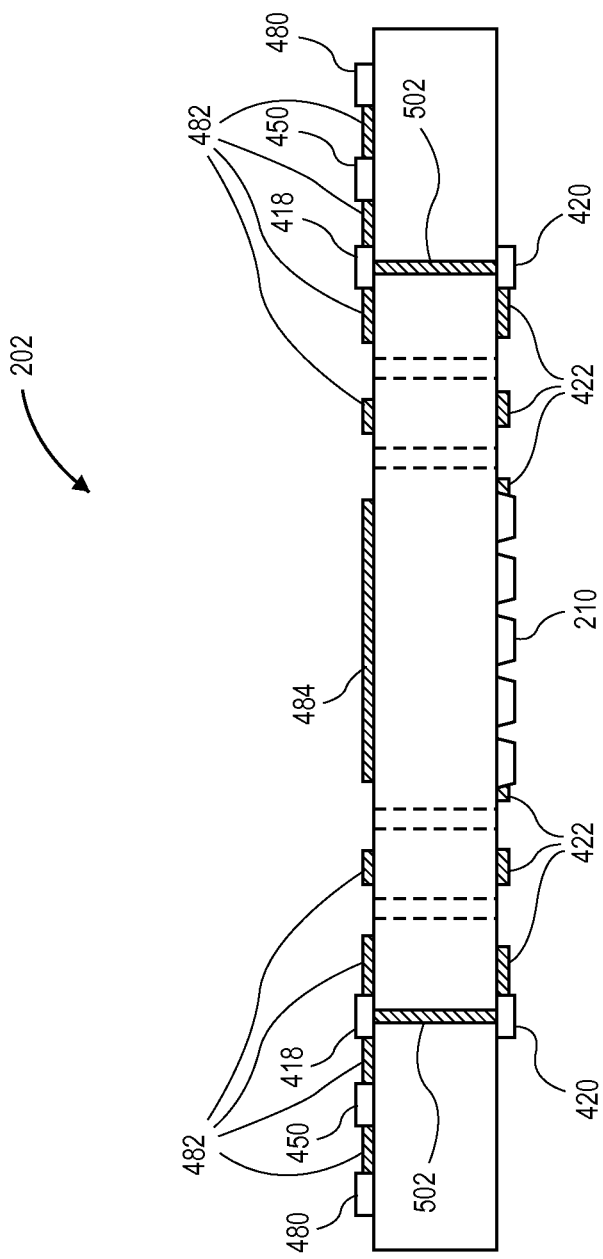
FIG. 5A is a side view illustration of a micro pick up array having a self-aligning pivot platform in accordance with an embodiment of the invention.
Figure 5B:
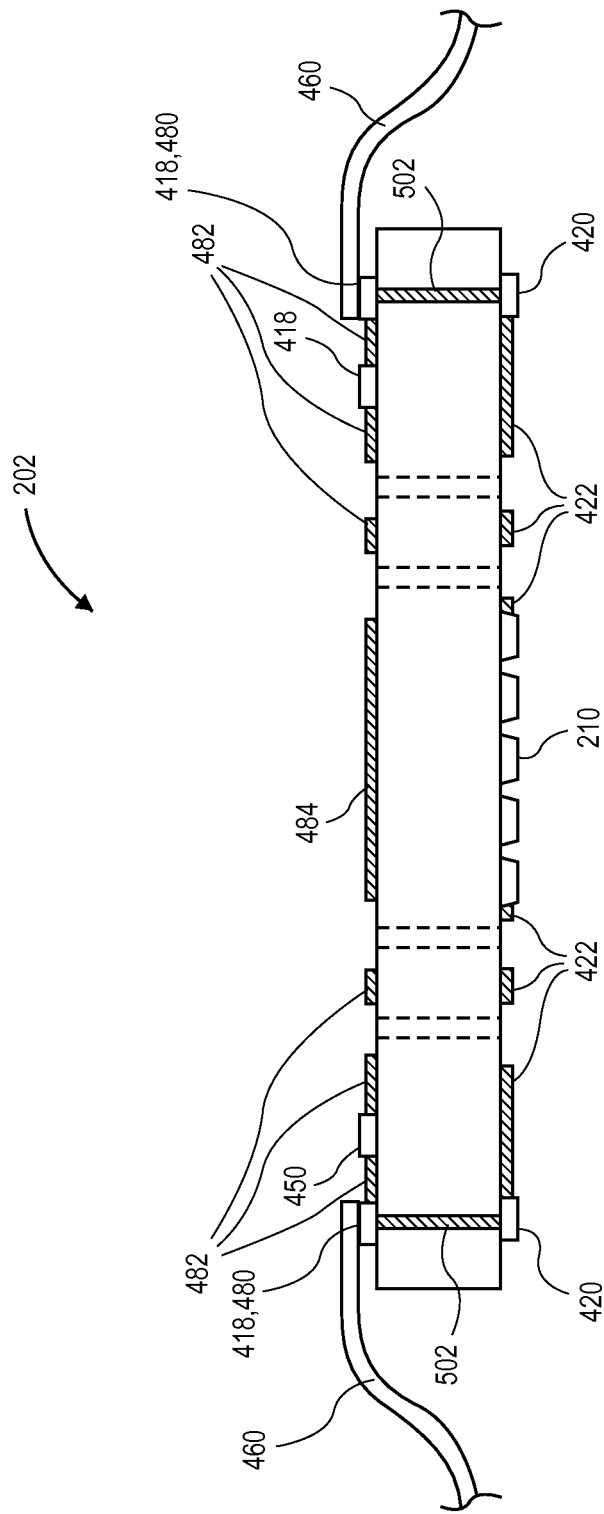
FIG. 5B is a side view illustration of a micro pick up array having a self-aligning pivot platform in accordance with an embodiment of the invention.

Referring now to FIG. 5A, a side view illustration of a micro pick up array having a self-aligning pivot platform is shown in accordance with an embodiment of the invention. For example, this illustration corresponds to the micro pick up array embodiment shown in FIGS. 4A-4B. Operating voltage source contact 418 may be placed in electrical connection with one or more electrostatic transfer heads 210 through via 502 and trace 422. Operating voltage source contact 418 may act as a landing pad for a via structure 502, which extends through the micro pick up array 202 to an opposite landing pad 420. Trace 422 may extend from landing pad 420 and run over one or more portions of micro pick up array 202. For example, trace 422 may run over base 402, beam 406, and pivot platform 404 to place landing pad 420 in electrical connection with electrostatic transfer head 210. Furthermore, heating contacts 480 may be placed in electrical connection with heating element 484 through heating leads 482 traversing base 402, beams 406, and portions of pivot platform 404.

Referring to FIG. 5B, a side view illustration of a micro pick up array having a self-aligning pivot platform is shown in accordance with an embodiment of the invention. For example, this illustration corresponds to the micro pick up array embodiment shown in FIGS. 4C-4D. Traces 422 are located on the same side of micro pick up array 202 as the array of electrostatic transfer heads 210. Traces 422 may place electrostatic transfer heads 210 in electrical communication with landing pads 420. Landing pads 420 may be electrical connection with operating voltage source contacts 418 through via 502. Furthermore, ribbon cables 460 may extend from operating voltage source contacts 418, or a connector in electrical communication therewith, to an external component, such as a connector associated with the transfer head assembly 204. In this way an operating voltage can be conveyed from an electrostatic voltage source of transfer head assembly 204 to electrostatic transfer heads 210. Ribbon cables 460 may furthermore be in electrical communication with heating contacts 480 through a connector. Thus, the same connector may include terminals for operating voltage source contact 418 and heating contacts 480. Furthermore, heating contacts 480 may be placed in electrical connection with heating element 484 through heating leads 482 traversing base 402, beams 406, and portions of pivot platform 404.

Figure 5C:
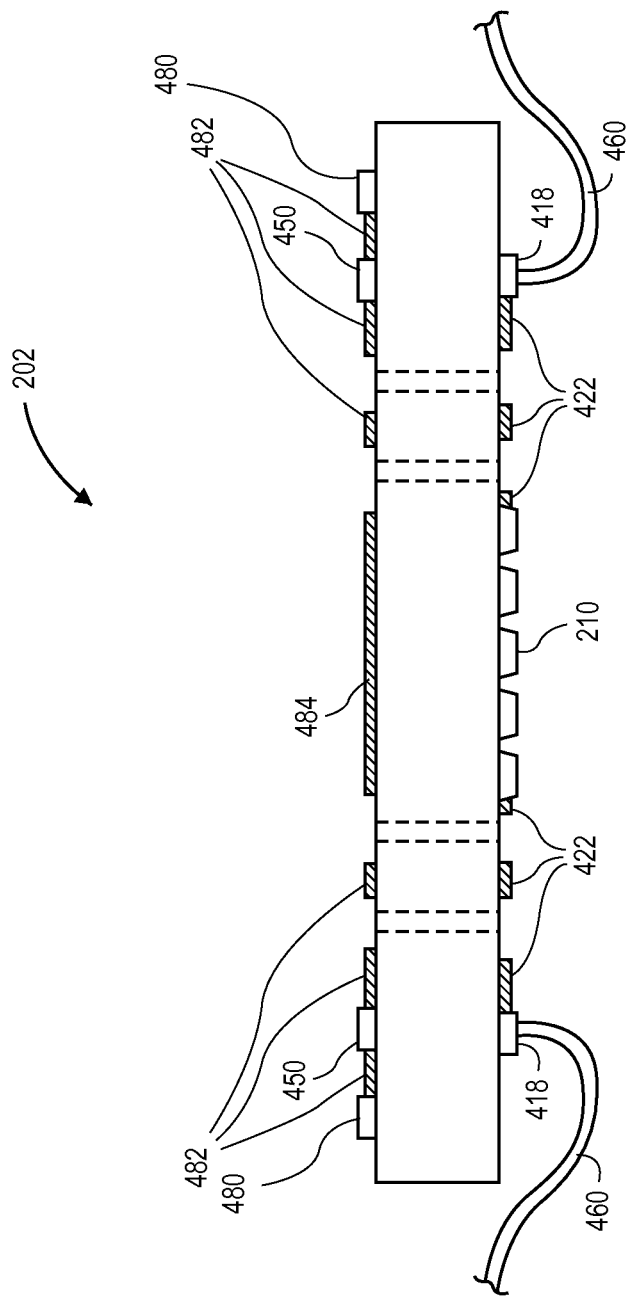
FIG. 5C is a side view illustration of a micro pick up array having a self-aligning pivot platform in accordance with an embodiment of the invention.

Referring to FIG. 5C, a side view illustration of a micro pick up array having a self-aligning pivot platform is shown in accordance with an embodiment of the invention. In an alternative embodiment, ribbon cables 460 connect to a connector on the same side of micro pick up array 202 as electrostatic transfer heads 210. For example, ribbon cables 460 may connect to operating voltage source contacts 418. Thus, traces 422 may be located on a same side of micro pick up array 202 as both operating voltage source contacts 418 and electrostatic transfer heads 210, eliminating the need for a via structure through micro pick up array 202 to place those components in electrical connection. Furthermore, heating contacts 480 may be placed in electrical connection with heating element 484 through heating leads 482 traversing base 402, beams 406, and portions of pivot platform 404.

In some embodiments, the micro pick up array 202 may further be constructed to be secured or clamped to the transfer head assembly 204 with electrostatic principles. One or more clamp voltage source contacts 450 may be formed on the backside of the micro pick up array 202 to align with a clamp voltage source connection (FIG. 9) of the transfer head assembly 204. The clamp voltage source contacts 450 may be on a separate edge of base 402 from operating voltage source contact 418, or near the same edge, as shown in FIGS. 4A and 4D. In accordance with the principles of electrostatic grippers, using the attraction of opposite charges, a dielectric layer may be formed over the clamp voltage source connections and/or the clamp voltage source contacts 450. Clamp voltage source contacts 450 can be formed by a variety of methods and assume a variety of configurations. In one embodiment, clamp voltage source contacts 450 are conductive pads, such as a metal or semiconductor film, formed on the back surface of the micro pick up array 202. The conductive pads may be electrically isolated from the other active regions of the micro pick up array 202. For example, insulating layers may be formed under, over, and around the conductive pads.

It is to be appreciated that electrostatic clamping represents one manner for retaining the micro pick up array, and that other manners may be utilized such as vacuum, mechanical fasteners, adhesive, etc. as described in further detail below with regard to FIGS. 9A-9B. Accordingly, clamp voltage source contacts 450 are optional and are not required.

Figure 6:
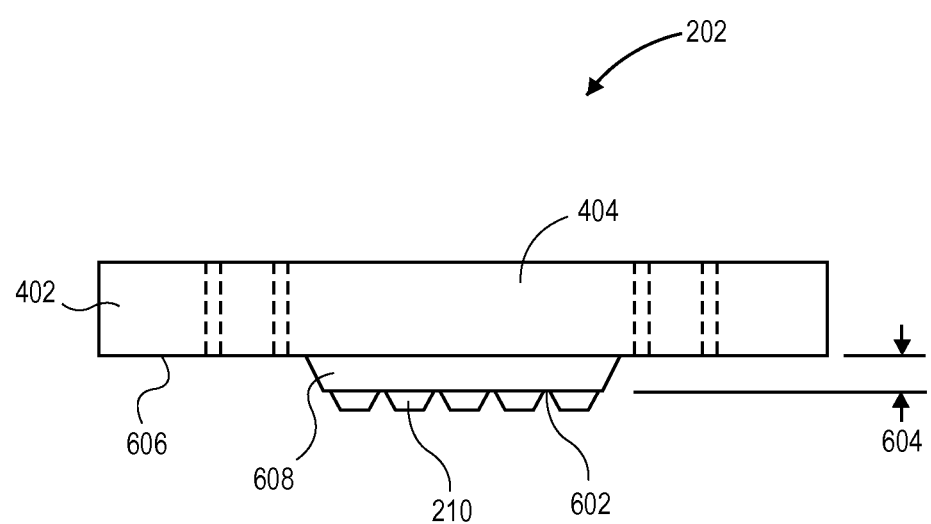
FIG. 6 is a side view illustration of a micro pick up array having a self-aligning pivot platform in accordance with an embodiment of the invention.

Referring now to FIG. 6, a side view illustration of a micro pick up array having a self-aligning pivot platform is shown in accordance with an embodiment of the invention. In an embodiment, pivot platform 404 includes a platform surface 602 supporting one or more electrostatic transfer heads 210. Platform surface 602 may be offset distance 604 from a top surface 606 of base 402. More particularly, platform surface 602 may be spaced farther apart from mounting surface 620 of micro pick up array 202, which mounts on transfer head assembly 204, than the distance between mounting surface 620 and top surface 606. Thus, an object, e.g., carrier substrate 302, will contact electrostatic transfer heads 210 prior to contacting top surface 606 when micro pick up array 202 is advanced into the object. This permits pivot platform 404 to self-align with an external object prior to the object contacting, e.g., base 402. In an embodiment, offset distance 604 is approximately the same, or larger than, a deflection distance of the pivot platform. For example, in an embodiment, the range of motion of pivot platform 404, and thus distance 604, may be in a range of about 2 to 10 micrometers. Even more particularly, in an embodiment, pivot platform 404 may deflect approximately 10 micrometers.

In an embodiment, platform surface 602 may be located on spacer portion 608 that is integrally formed as a region of pivot platform 404. However, in alternative embodiments, spacer portion 608 may be with a separate layer than pivot platform 404 to provide a platform surface 602 that is offset from top surface 606. For example, spacer portion 608 may be a thin film that is deposited, grown, or adhered to a surface of pivot platform 404. In an embodiment, spacer portion 608 is a portion of the top device layer of a silicon-on-insulator (SOI) substrate, with the pivot platform being formed form the bulk substrate of the SOI substrate. In an embodiment, spacer portion 608 is integrally formed with the mesa structures of the electrostatic transfer heads 210. Spacer portion may also function as an electrode lead as describe in further detail with regard to FIGS. 8A-8B below.

Figure 7A:
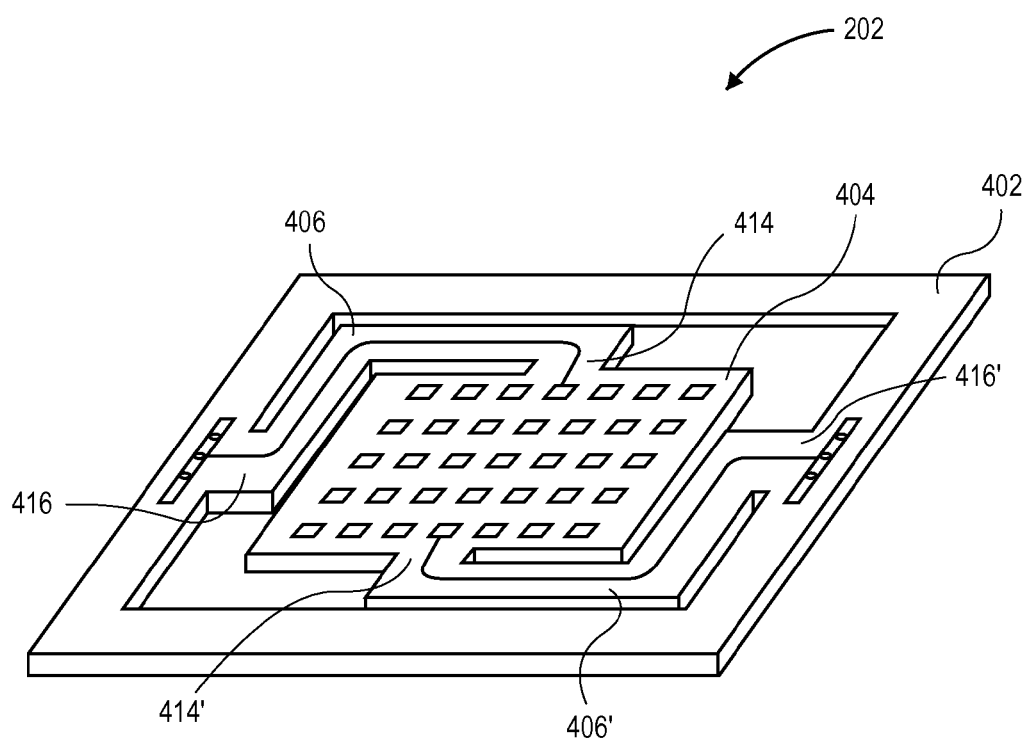
FIG. 7A is a perspective view illustration of a micro pick up array having two beams laterally around a portion of a self-aligning pivot platform in accordance with an embodiment of the invention.
Figure 7B:
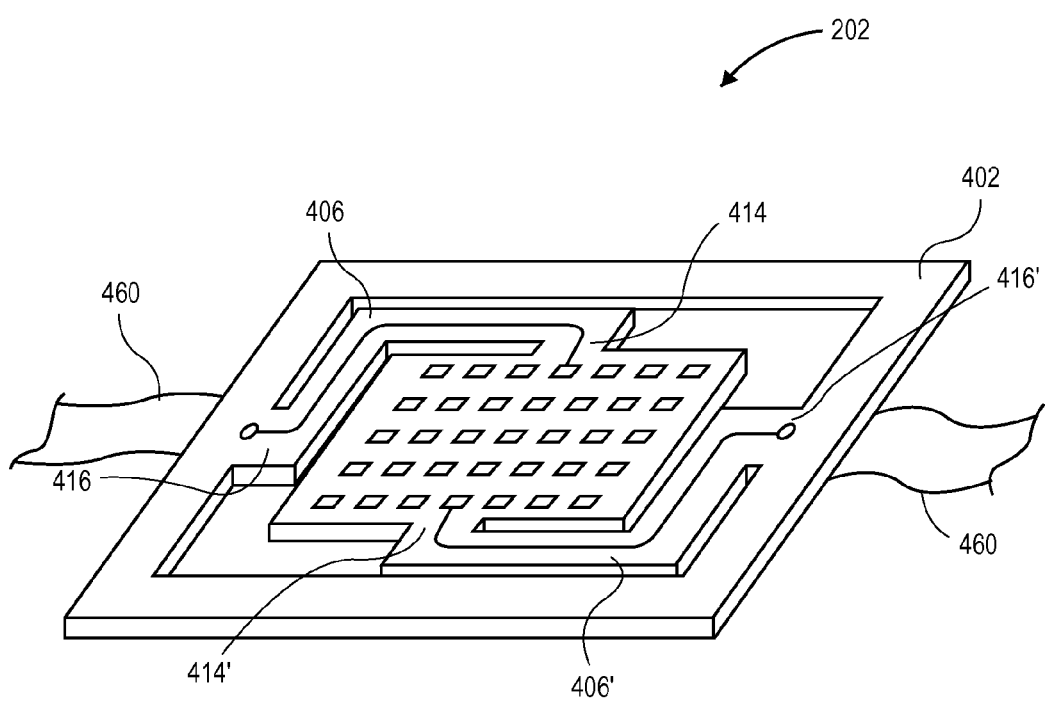
FIG. 7B is a perspective view illustration of a micro pick up array having two beams laterally around a portion of a self-aligning pivot platform in accordance with an embodiment of the invention.
Figure 7C:
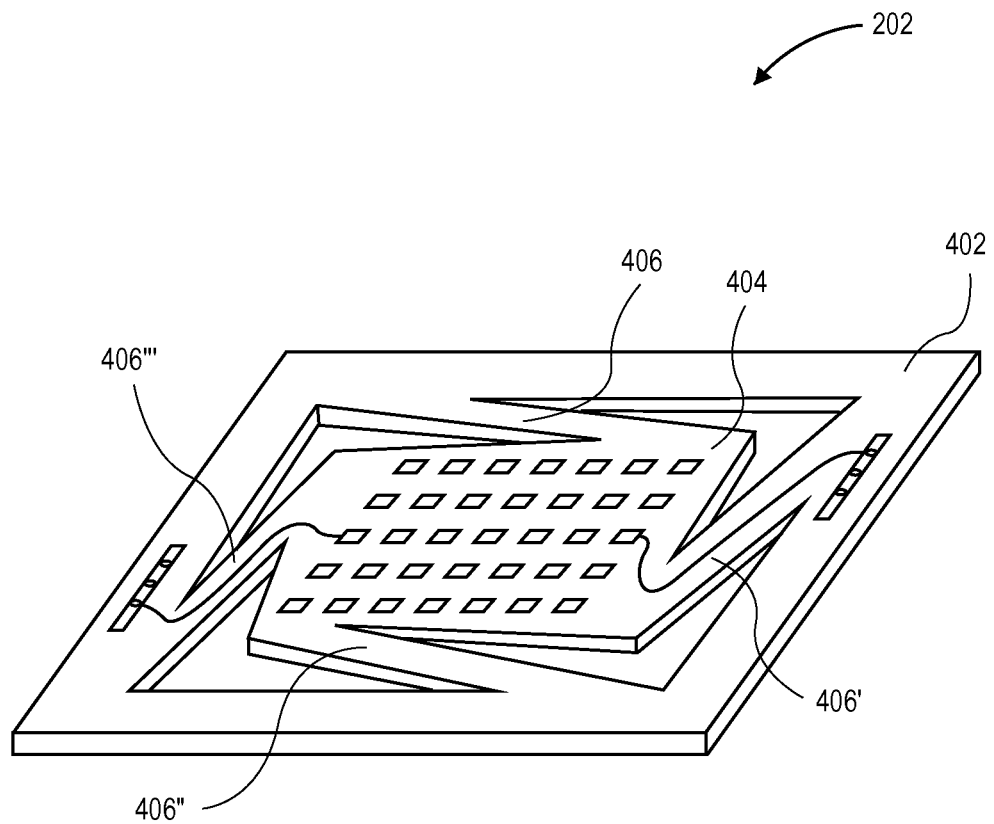
FIG. 7C is a perspective view illustration of a micro pick up array having four beams between a self-aligning pivot platform and a base in accordance with an embodiment of the invention.
Figure 7D:
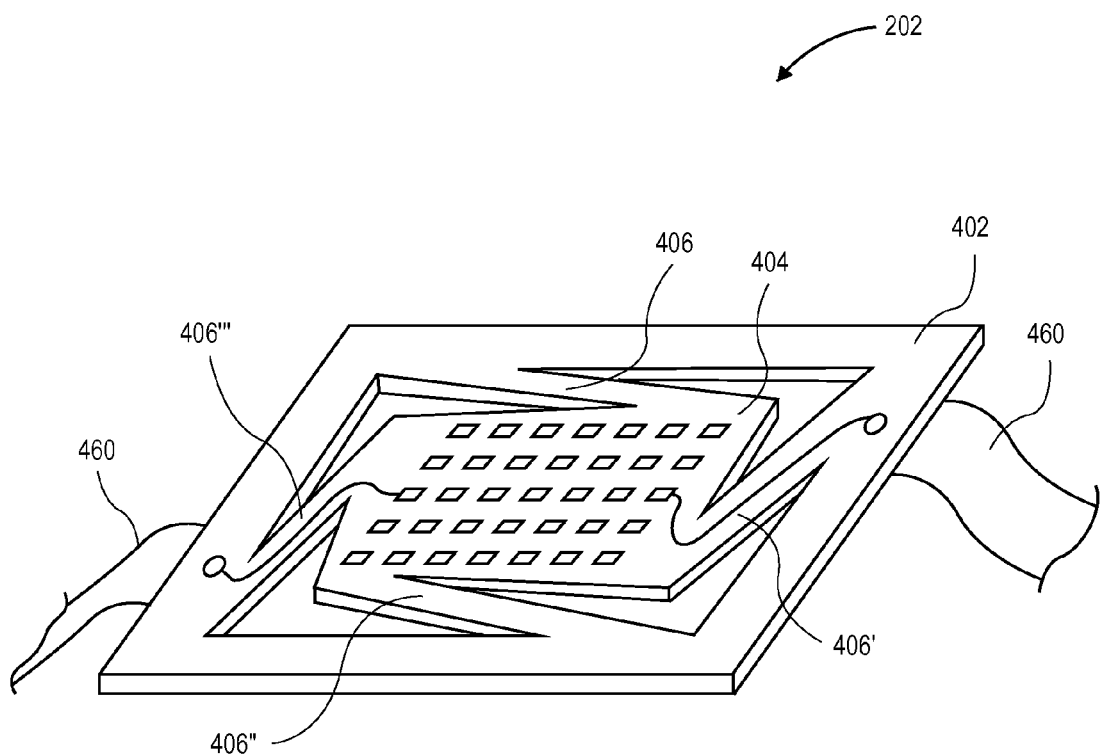
FIG. 7D is a perspective view illustration of a micro pick up array having four beams between a self-aligning pivot platform and a base in accordance with an embodiment of the invention.

Alternative structural configurations of micro pick up array 202 are shown in FIGS. 7A-7D. Referring to FIGS. 7A and 7B, a perspective view illustration of a micro pick up array having two beams laterally around a portion of a self-aligning pivot platform is shown in accordance with an embodiment of the invention. With respect to FIG. 7A, micro pick up array 202 includes base 402 structurally connected with pivot platform 404 by beams 406 and 406'. Thus, in an embodiment, beams 406 may be discontinuous and not completely laterally surround pivot platform 404. More specifically, pivot platform 404 may be supported at one side by beam 406 connected with pivot platform 404 at inner pivot 414 and base 402 at and outer pivot 416. Similarly, pivot platform 404 may be supported at an opposite side by beam 406' connected with pivot platform 404 at inner pivot 414' and base 402 at outer pivot 416'. With respect to FIG. 7B, in an embodiment, micro pick up array 202 includes ribbon cables 460 to electrically connect electrostatic transfer heads 210 with an external electrostatic voltage source as described above with respect to FIGS. 4C-4D and FIG. 5B-5C. Referring to FIG. 7C and FIG. 7D, a perspective view illustration of a micro pick up array having four beams between a self-aligning pivot platform and a base is shown in accordance with an embodiment of the invention. With respect to FIG. 7C, micro pick up array 202 includes base 402 structurally connected with pivot platform 404 by beams 406, 406', 406", and 406'". Thus, in an embodiment, multiple beams may support each side of pivot platform 404. As shown, each beam may have a substantially linear configuration extending diagonally between pivot platform 404 and base 402. Alternatively, the beams may extend orthogonally from base 402 to pivot platform 404. Thus, various beam configurations may be used to tune the stiffness of the micro pick up array 202 while providing a self-aligning structure in which pivot platform 404 may move in multiple planes and along or about multiple axes relative to base 402. With respect to FIG. 7D, in an embodiment, micro pick up array 202 includes ribbon cables 460 to electrically connect electrostatic transfer heads 210 with an external electrostatic voltage source as described above with respect to FIGS. 4C-4D and FIG. 5B-5C.

Figure 8A:
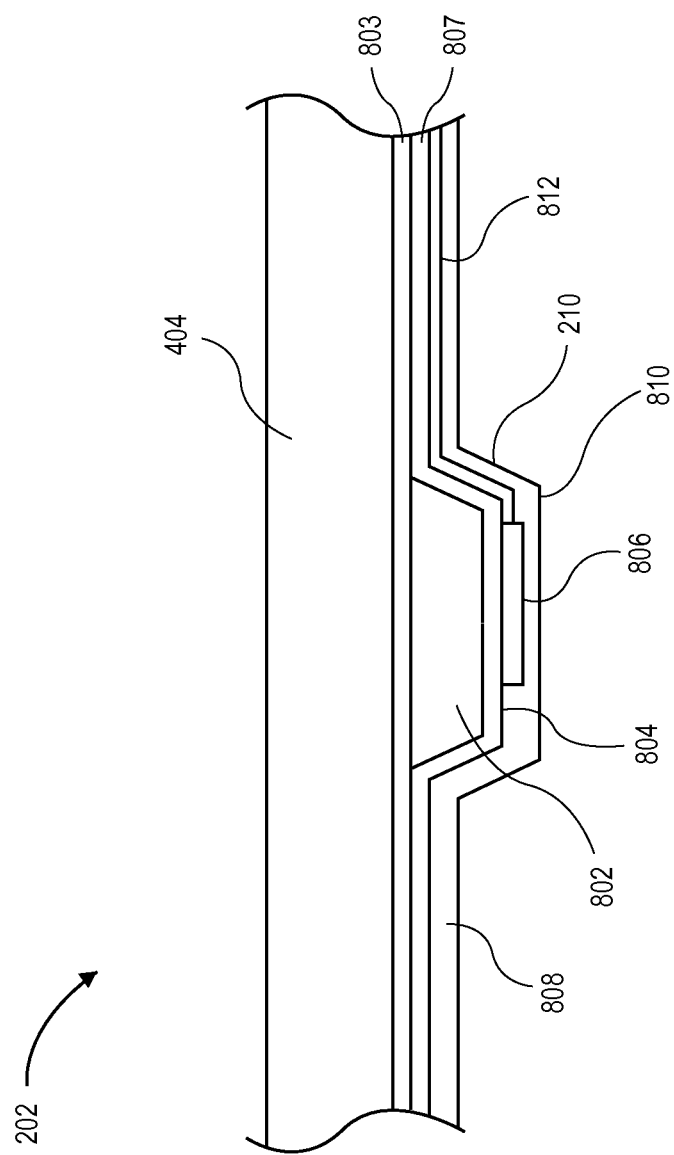
FIG. 8A is a side view illustration of a portion of a micro pick up array supporting an electrostatic transfer head in accordance with an embodiment of the invention.

Referring now to FIG. 8A, a side view illustration of a portion of a micro pick up array supporting an electrostatic transfer head is shown in accordance with an embodiment of the invention. Micro pick up array 202 may include a bulk substrate, of which pivot platform 404 may be a portion. The bulk substrate may be formed from one or more of silicon, ceramics, insulators, and polymers, supporting an array of electrostatic transfer heads 210. In an embodiment, the base 402, beams (e.g. 406), and pivots (e.g. 408, 414, 410, 416) are all formed from the bulk substrate. In an embodiment, each electrostatic transfer head 210 may include a mesa structure 802 including a mesa surface 804, which may support an electrode 806. However, electrode 806 is illustrative, and in another embodiment, mesa structure 802 can be wholly or partially conductive, such that electrode 806 is not necessary. In an embodiment, each mesa structure 802 is also formed from the bulk substrate. In another embodiment, the mesa structures are formed form a device layer above the bulk substrate. For example, the mesa structures 802 may be formed from a top device layer in a SOI substrate, with the device layer from which the mesa structures 802 are formed being separated from the bulk substrate with a buried oxide layer 803. Where mesa structures 802 are formed of silicon or another electrically conductive material, an insulating layer 807 may be formed over the mesa structure, and optionally the bulk substrate where electrode 806 and any other electrical connections such as electrode leads 812, landing pads, or contacts are deposited on the base substrate. A dielectric layer 808 covers a mesa surface 804 and electrode 806, if present. The top contact surface 810 of each electrostatic transfer head 210 has a maximum dimension, for example a length or width of 1 to 100 µm, which may correspond to the size of a micro device to be picked up. Electrode lead 812 may place electrode 806 or mesa structure 802 in electrical connection with operating voltage source contacts 418 through an electrical pathway as described above. Electrode lead 812 may be formed using methods similar to those described above for other leads, vias, contacts, and connections.

Figure 8B:
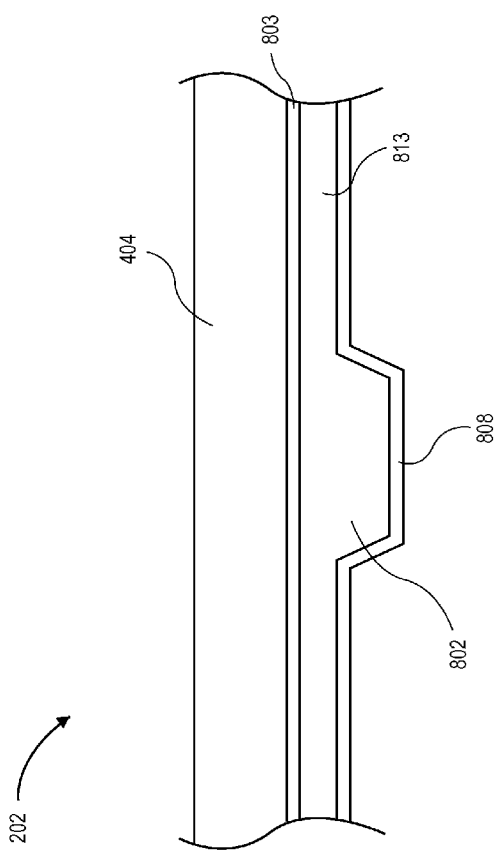
FIG. 8B is a side view illustration of a portion of a micro pick up array supporting an electrostatic transfer head in accordance with an embodiment of the invention.

In an embodiment illustrated in FIG. 8B, the mesa structures 802 and electrode leads 813 are formed from a top device layer in an SOI substrate, with the device layer from which the mesa structures 802 and electrode leads 813 are formed being separated from the bulk substrate with a buried oxide layer 803. In such an embodiment, the mesa structures 802 may function as the electrodes. Alternatively, electrodes 806 may be formed over the mesa structures, and optionally electrode leads, as described above.

Mesa structure 802 protrudes away from bulk substrate, e.g., pivot platform 404, so as to provide a localized contact point of the top contact surface 810 to pick up a specific micro device during a pick up operation. In an embodiment, mesa structure 802 has a height of approximately 1 µm to 5 µm, or more specifically approximately 2 µm. In an embodiment, mesa structure 802 may have mesa surface 804 with surface area between 1 to 10,000 square micrometers. Mesa structure 802 may be formed in a variety of shapes and geometries while maintaining this general surface area range. The height, width, and planarity of the array of mesa structures 802 on bulk substrate, e.g., pivot platform 404, are chosen so that each electrostatic transfer head 210 can make contact with a corresponding micro device during a pick up operation, and so that an electrostatic transfer head 210 does not inadvertently make contact with a micro device adjacent to an intended corresponding micro device during the pick up operation.

Figure 9A:
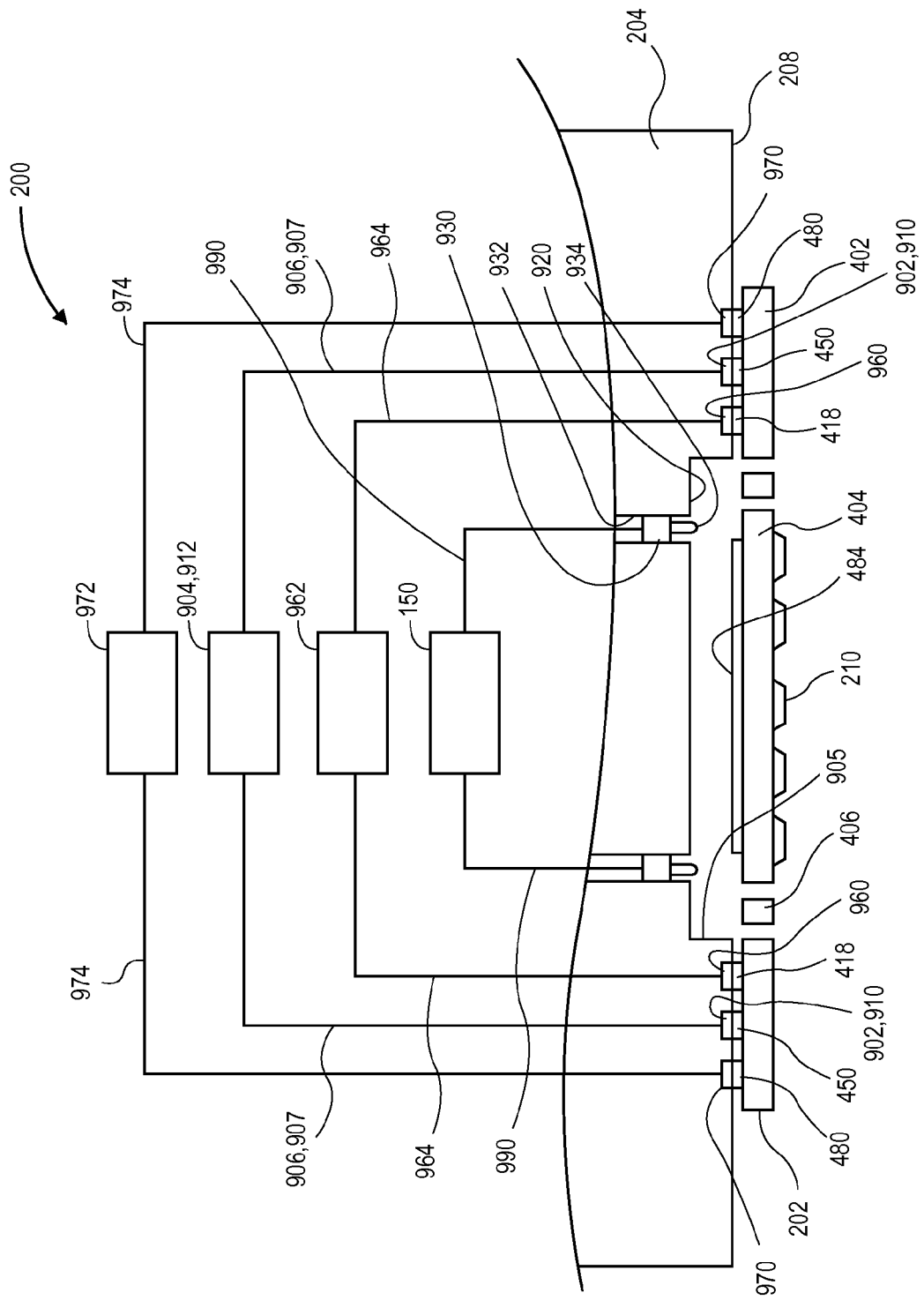
FIG. 9A is a cross-sectional side view illustration showing a portion of a micro device transfer system including a micro pick up array mounted on a transfer head assembly in accordance with an embodiment of the invention.

Referring to FIG. 9A, a cross-sectional side view illustration showing a portion of a micro device transfer system including a micro pick up array mounted on a transfer head assembly is shown in accordance with an embodiment of the invention. Micro device transfer system 200 may include micro pick up array 202 joined with transfer head assembly 204. For example, micro pick up array 202 may be attached with transfer head assembly pneumatically, electrostatically, or mechanically. In an embodiment, micro pick up array 202 may be placed against mounting surface 208 of transfer head assembly 204 and a holding mechanism of transfer head assembly 204 may be activated to retain micro pick up array 202. For example, in at least one embodiment micro pick up array 202 may be releasably attached and detached from the mounting surface 208 by applying a suction through vacuum port 902 in mounting surface 208. Vacuum port 902 may be coupled with vacuum source 904 for drawing suction on an object placed against mounting surface 208. More particularly, when micro pick up array 202, is positioned against mounting surface 208, suction may be drawn through vacuum port 902 to create a negative pressure within one or more vacuum channels 906 to hold micro pick up array 202 against mounting surface 208. When the vacuum source is disconnected or the negative pressure in the vacuum channel 906 is insufficient to retain micro pick up array 202, micro pick up array 202 may be released and removed.

In an alternative embodiment, micro pick up array 202 may be retained against mounting surface 208 by an electrostatic force. In such an embodiment, rather than applying suction to micro pick up array 202 through vacuum port 902, clamp voltage source connection 910 and lead 907 may replace vacuum port 902 and vacuum channel 906. Electrostatic voltage may be applied to clamp voltage source connection 910 from a clamp voltage source 912, which replaces the vacuum source 904. In such an embodiment, micro pick up array 202 may include a clamp voltage source contact 450, as described above. Thus, when the clamp voltage source contact 450 is placed adjacent the clamp voltage source connection 910, an electrostatic force may be applied to retain micro pick up array 202 against mounting surface 208.

Numerous other manners of retaining micro pick up array 202 may be used. For example, in another embodiment, one or more mechanical fasteners may be used to retain micro pick up array 202 against mounting surface 208. As an example, screws can be placed in through holes formed in base 402 and threaded into counter bored holes in mounting surface 208 such that a head of the screw, e.g., of a cap screw, will retain the base 402 against the mounting surface 208. Alternatively, clips can be used, such as spring loaded clips, to fasten the base 402 against the mounting surface 208. In this case, the clips can apply a fastening load to base 402 on the same side as of micro pick up array 202 as electrostatic transfer heads 210. Other mechanical retaining features such as pins may be used to retain micro pick up array 202 against mounting surface 208. Additionally, alternative bonding mechanisms, such as adhesives can be used to retain the micro pick up array 202. For example, an appropriate adhesive can be used to form a bond between mounting surface 208 and base 402, depending on the materials used to form transfer head assembly 204 and micro pick up array 202.

Transfer head assembly 204 may also include electrical interconnects for supplying an operating voltage to micro pick up array 202. As described above, an electrostatic voltage may be supplied to the electrostatic transfer heads 210 of micro pick up array 202 to apply a gripping pressure to adjacent micro devices. In order to induce this gripping pressure, transfer head assembly 204 may supply an electrostatic voltage to operating voltage source contact 418 through operating voltage source connection 960. More particularly, operating voltage source connection 960 may supply electrostatic voltage to operating voltage source contact 418 from an operating voltage source 962 connected with operating voltage source connection 960 by various wires or other electrical interconnects 964. As discussed above, the electrostatic voltage delivered to operating voltage source connection 960 may propagate through various vias, traces, and connections in an operating voltage pathway from operating voltage source contacts 418 to the electrostatic transfer heads 210.

Transfer head assembly 204 may further include electrical interconnects for supplying a heating current to micro pick up array 202. As described above, an electrical current may be introduced to heating contacts 480 to raise the temperature of heating element 484. Heating contacts 480 of micro pick up array 202 may be placed in electrical connection with heating connection 970 of transfer head assembly 204 to receive the electrical current. More particularly, heating connection 970 can transfer electrical current supplied by heating current source 972 through heating connection leads 974. As discussed above, running electrical current through heating element 484 causes the element to generate heat that may transfer to electrostatic transfer heads 210 on micro pick up array 202. More particularly, heat may be transferred from heating element 484 to micro devices placed in contact with electrostatic transfer heads 210 on micro pick up array 202.

Transfer head assembly 204 may further include recessed surface 920, which is generally configured to align with and receive pivot platform 404 and beams 406 when pivot platform 404 is deflected relative to base 402. For example, recessed surface 920 and sidewall profile 905 are formed within mounting surface 208 of transfer head assembly 204 to form a cavity. Thus, pivot platform 404 may float over the cavity in the mounting surface 208 that opposes and retains base 402 of micro pick up array 202.

Micro device transfer system 900 may also include one or more sensors to detect deflection of a portion of micro pick up array 202. In an embodiment, sensors 930 are fixed relative to transfer head assembly 204. More particularly, sensors 930 may include a threaded body that is screwed into a sensor channel 932 extending from recessed surface 920. Furthermore, sensors 930 may include probe 934, configured to extend beyond recessed surface 920 in the direction of pivot platform 404. Accordingly, when pivot platform 404 of micro pick up array 202 is undeflected, probe 934 of sensor 930 will remain in an extended state. Sensor 930 may be a contact sensor and probe 934 may be a spring-loaded probe of the contact sensor. The contact sensor may act as a switch or a feedback mechanism. For example, sensor 930 may be a switch with a normally opened state when probe 934 is in an extended position.

In an embodiment, sensor 930 may effectively be a contact of an open circuit. In such a case, the open circuit may close when the contact is touched by pivot platform 404 or another conductive portion of micro pick up array 202. More specifically, a source may supply voltage to a lead that extends from a positive terminal of the source to sensor 930. Furthermore, a lead may extend from a negative terminal of the source to a surface of micro pick up array 202. The surface may be metallized, for example, to increase the local conductivity. Thus, when sensor 930 contacts the conductive surface of micro pick up array 202, the circuit closes for current to flow. This current may be sensed by an external sensor, e.g., by a current sensor, that then delivers a signal to computer system 150 indicating that the micro pick up array 202 has deflected into contact with sensor 930.

A contact sensor is only one example of a sensor that may be used to detect deflection of micro pick up array 202. For example, non-contact sensors, including laser interferometers capable of sensing absolute position of a remote object, may be used to detect when the pivot platform 404 has deflected from an original position and/or come into contact with recessed surface 920. In other embodiments sensor 1030 may include proximity sensors, optical sensors, and ultrasonic sensors.

One or more of these sensors may determine movement of pivot platform 404 without acting as a hard stop that prevents additional movement of pivot platform 404 as it deflects. In other words, sensor 930, whether of a contact or non-contact type, may detect movement of pivot platform 404 without impeding the deflection of pivot platform 404.

Sensor 930 may provide input and feedback to computer system 150 through one or more leads 990 to control various actuators of mass transfer tool 100. For example, sensor 930 may be connected with I/O ports of computer system 150 to deliver signals related to the sensor 930 being in an open or closed state. Based on state of sensor 930, computer system 150 may determine whether a specific condition is met, e.g., whether micro pick up array 202 is in a deflected condition, and thus, may provide control signals to actuators or intermediate motion controllers to regulate the movement of mass transfer tool 100.

Several sensors 930 may be located at various locations on transfer head assembly 204. For example, in an embodiment, a sensor 930 may be located in each corner of recessed surface 920 or be spaced across surface 920. Multiple sensors 930 provide more response to deflection of pivot platform 404 in that each sensor 930 may sense deflection of a different area of pivot platform 404. For example, sensor 930 in one corner of recessed surface 920 may sense deflection of one corner of pivot platform 404 while sensor 930 in another corner of recessed surface 920 may sense deflection of another corner of pivot platform 404. In this way, uneven deflection of pivot platform 404 relative to base 402 may be detected.

As mentioned above, pivot platform 404 may have a profile that is smaller than a profile of recessed surface 920. Thus, pivot platform 404 is able to deflect into the recessed portion without being obstructed by mounting surface 208, for example. Likewise, a profile of base 402 may have a larger profile than the profile of recessed surface 920. Thus, base 402 may remain rigidly fixed relative to mounting surface 208 even when a deflecting force is applied to pivot platform 404. That is, base 402 may be apposed by mounting surface 208 to resist base 402 movement and facilitate relative movement between base 402 and deflected pivot platform 404. Nonetheless, in at least one embodiment, a portion of base 402 could be smaller than a profile of recessed surface 920 while still allowing pivot platform 404 to move relative to base 402.

Figure 9B:
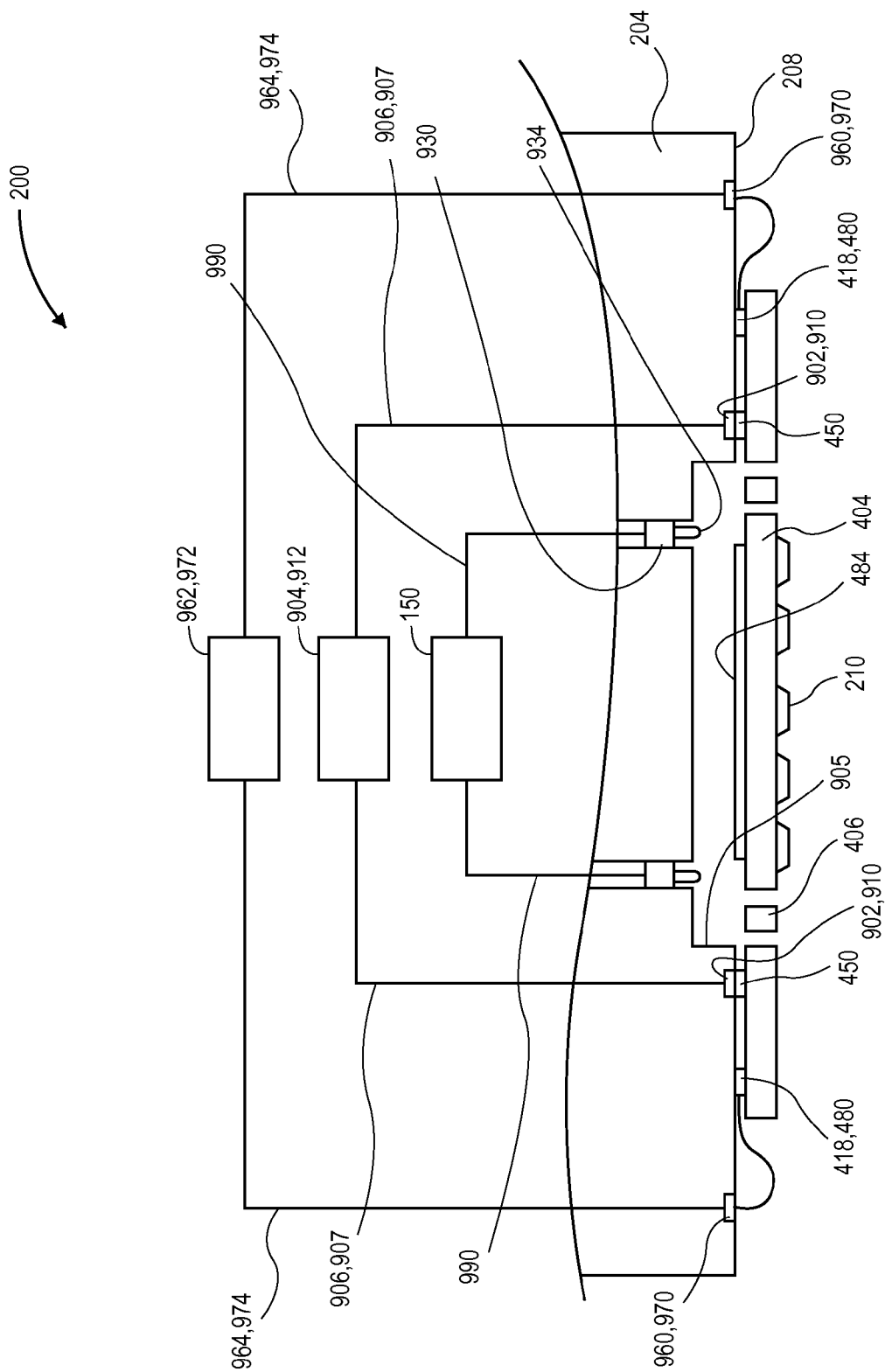
FIG. 9B is a cross-sectional side view illustration showing a portion of a micro device transfer system including a micro pick up array mounted on a transfer head assembly in accordance with an embodiment of the invention.

Referring to FIG. 9B, a cross-sectional side view illustration showing a portion of a micro device transfer system including a micro pick up array mounted on a transfer head assembly is shown in accordance with an embodiment of the invention. Micro pick up array 202 may be retained against mounting surface 208 of the transfer head assembly 204 using any of the manners described above with regard to FIG. 9A, such as mechanical fasteners, adhesive, vacuum, electrostatic, etc. In contrast to the embodiment illustrated in FIG. 9A, the electrical interconnects and supply routes of transfer head assembly 204 can be varied to incorporate ribbon cables 460. More particularly, ribbon cables 460 can include an electrical wire interconnecting operating voltage source contact 418 with operating voltage source connection 960. The wire of ribbon cable 460 can be connected through various contacts and/or connectors, such as insulation-displacement connectors. Thus, voltage can be supplied to operating voltage source connection 960 from electrostatic voltage source 962. Operating voltage can be transferred from operating voltage source contact 418 to electrostatic transfer heads 210 using traces and vias as described above.

Furthermore, ribbon cables 460 can include an electrical wire interconnecting heating contact 480 with heating connection 970. Thus, electrical current can be supplied to heating contact 480 from heating current source 972. Ribbon cables 460 can also be used to communicate electrical signals for a variety of purposes between transfer head assembly 204 and micro pick up array 202. For example, ribbon cables 460 can be used to transfer electrical signals from sensors, such as temperature sensor 440, placed on a surface of micro pick up array 202.

Figure 9C:
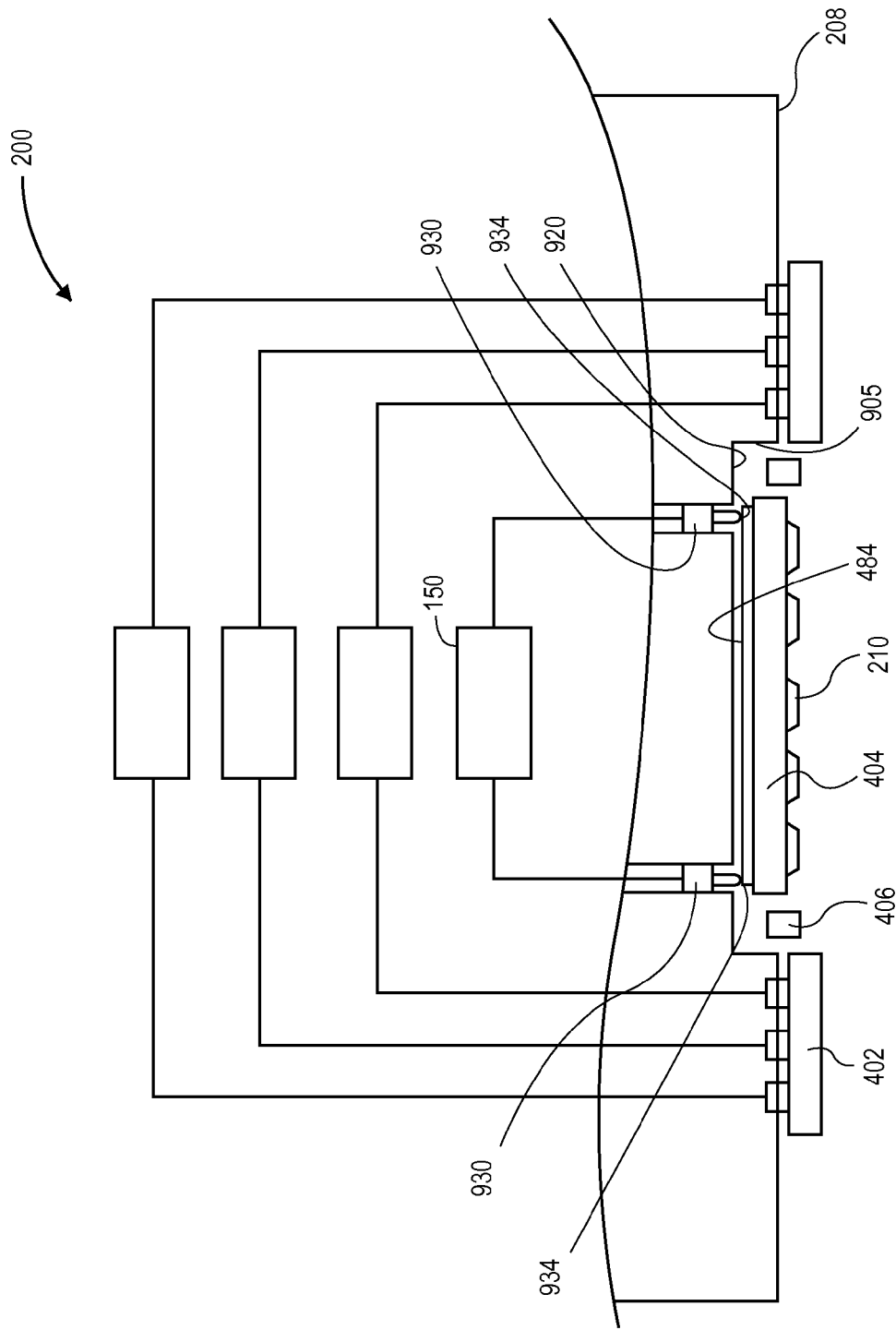
FIG. 9C is a cross-sectional side view illustration showing a portion of a micro device transfer system including a micro pick up array mounted on a transfer head assembly and a pivot platform deflected toward the transfer head assembly in accordance with an embodiment of the invention.

Referring to FIG. 9C, a cross-sectional side view illustration showing a portion of a micro device transfer system including a micro pick up array mounted on the transfer head assembly and a pivot platform deflected toward a transfer head assembly is shown in accordance with an embodiment of the invention. Deflection of pivot platform 404 may occur, for example, when array of electrostatic transfer heads 210 of micro pick up array 202 come into contact with an array of micro devices, a carrier substrate, a receiving substrate, or another external object. Pressure placed on the array of electrostatic transfer heads 210 causes deflection of pivot platform 404 and beam 406. As a result, those components may move into the recess within sidewall profile 905 of mounting surface 208, eventually contacting and triggering one or more of sensors 930. Although pivot platform 404 is shown as being generally parallel to recessed surface 920, pivot platform 404 could be tilted. For example, array of electrostatic transfer heads 210 could contact a carrier substrate plane that is not parallel to recessed surface 920, and thus, as pivot platform 404 deflects into the recessed region, it may tilt and trigger only one of the sensors, or depress one sensor more than another. Furthermore, sensors 930 may be configured to sense such uneven deflection of pivot platform 404 and to provide related feedback to control motion of the mass transfer tool 100, accordingly.

Figure 10:
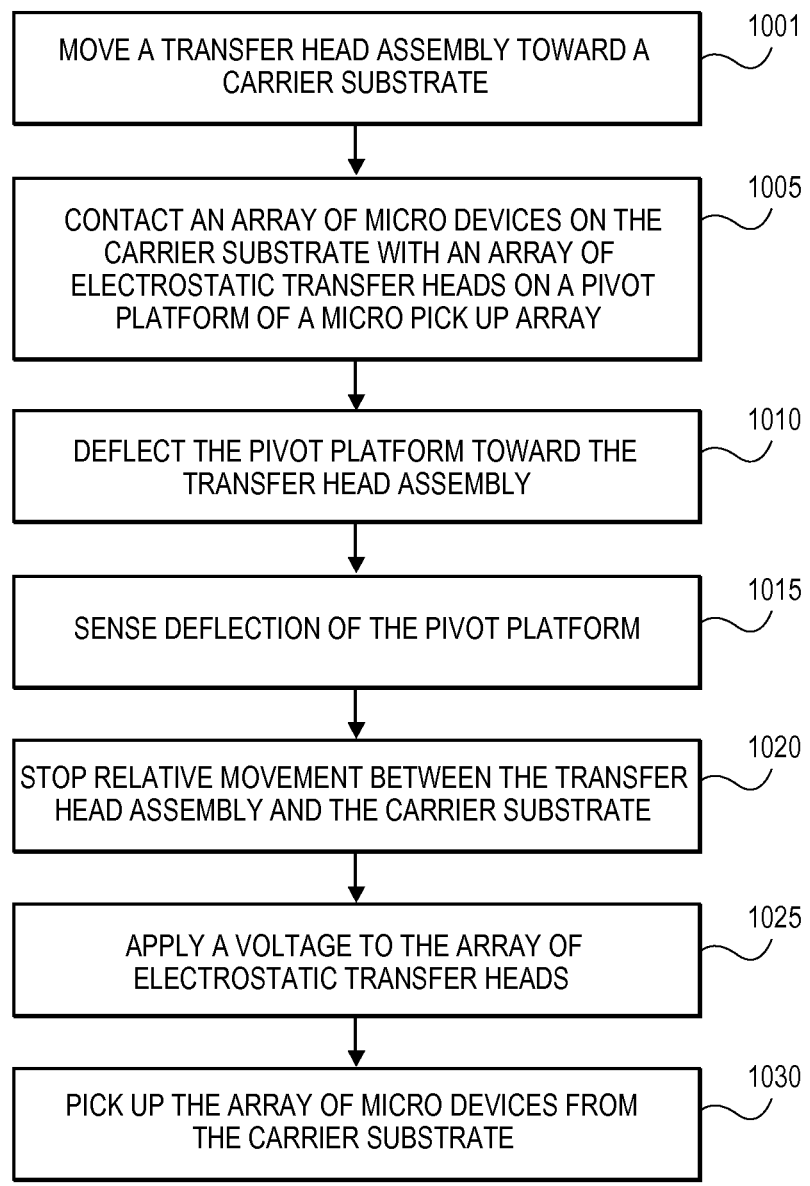
FIG. 10 is a flowchart illustrating a method of picking up an array of micro devices from a carrier substrate in accordance with an embodiment of the invention.
Figure 11A:
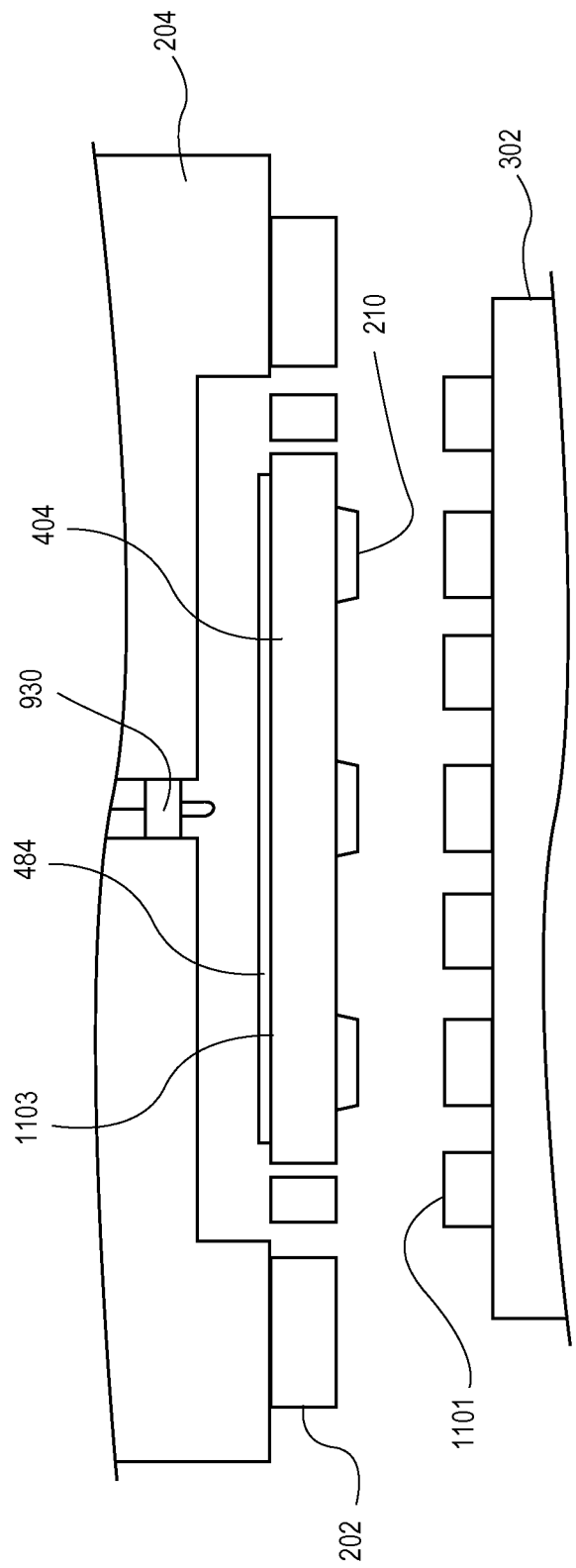
FIG. 11A is a cross-sectional side view illustration of a micro device transfer system having a transfer head assembly moving toward a carrier substrate in accordance with an embodiment of the invention.

Referring to FIG. 10, a flowchart illustrating a method of picking up an array of micro devices from a carrier substrate is shown in accordance with an embodiment of the invention. For illustrational purposes, the following description of FIG. 10 is also made with reference to the embodiments illustrated in FIGS. 11A-11D. At operation 1001, transfer head assembly 204 is moved toward carrier substrate 302. Referring to FIG. 11A, a cross-sectional side view illustration of a micro device transfer system having a transfer head assembly moving toward a carrier substrate is shown in accordance with an embodiment of the invention. The micro pick up array 202 may be mounted on transfer head assembly 204. As shown, pivot platform 404 may be undeflected, with a gap between a proximate surface 1103 of pivot platform 404 and one or more sensors 930. Furthermore, the micro device transfer system 200 is shown prior to contact being made between the array of electrostatic transfer heads 210 and the array of micro devices 1101 carried on the carrier substrate 302, and thus, there is a gap between those components. In this state, transfer head assembly 204 may be connected with various actuators of mass transfer tool 100, which move transfer head assembly 204 toward carrier substrate 302 under the direct or indirect control of computer system 150.

Figure 11B:
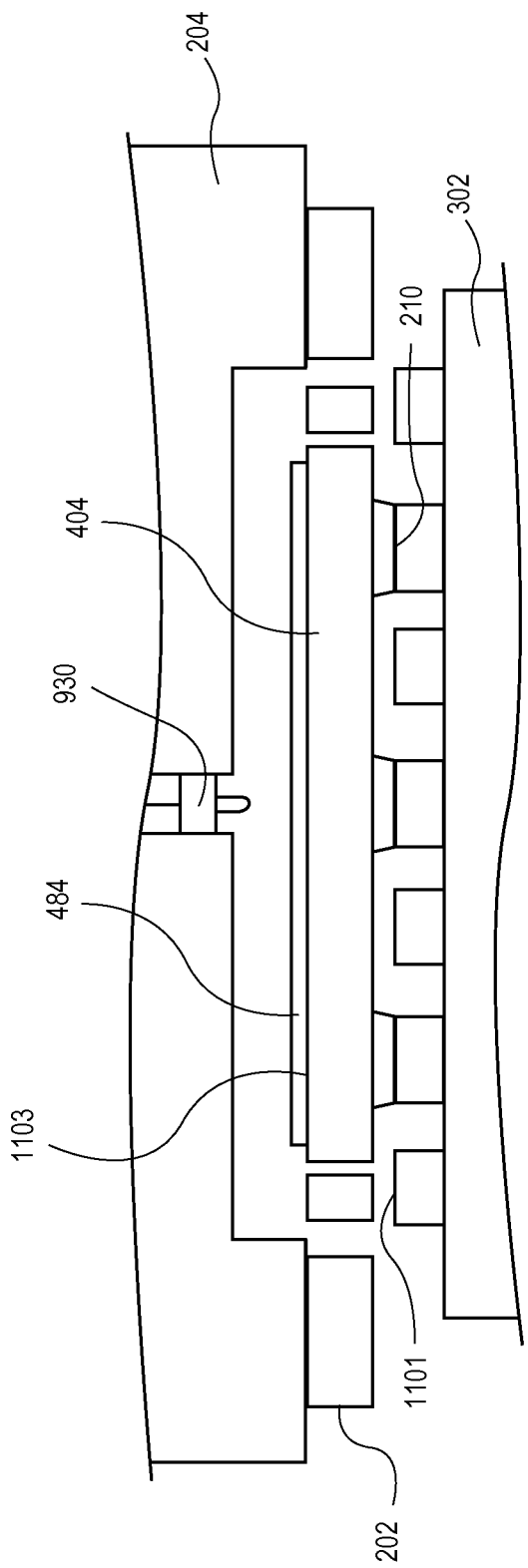
FIG. 11B is a cross-sectional side view illustration of a micro device transfer system having an array of electrostatic transfer heads contacting an array of micro devices on a carrier substrate in accordance with an embodiment of the invention.

Referring again to FIG. 10, at operation 1005, electrostatic transfer heads 210 carried on micro pick up array 202 contact an array of micro devices 1101 on carrier substrate 302. Referring to FIG. 11B, a cross-sectional side view illustration of a micro device transfer system having an array of electrostatic transfer heads contacting an array of micro devices on a carrier substrate is shown in accordance with an embodiment of the invention. As an example, mass transfer tool 100 actuators have moved transfer head assembly 204 toward carrier substrate 302 until the gap between the array of micro devices 1101 and electrostatic transfer heads 210 has closed. However, pivot platform 404 remains undeflected, and therefore, the gap between sensor 930 and the proximate surface 1103 of pivot platform 404 remains unchanged from the state shown in FIG. 11A. Although shown in alignment, at this point one or more electrostatic transfer heads 210 may not be in contact with the array of micro devices 1101.

Figure 11C:
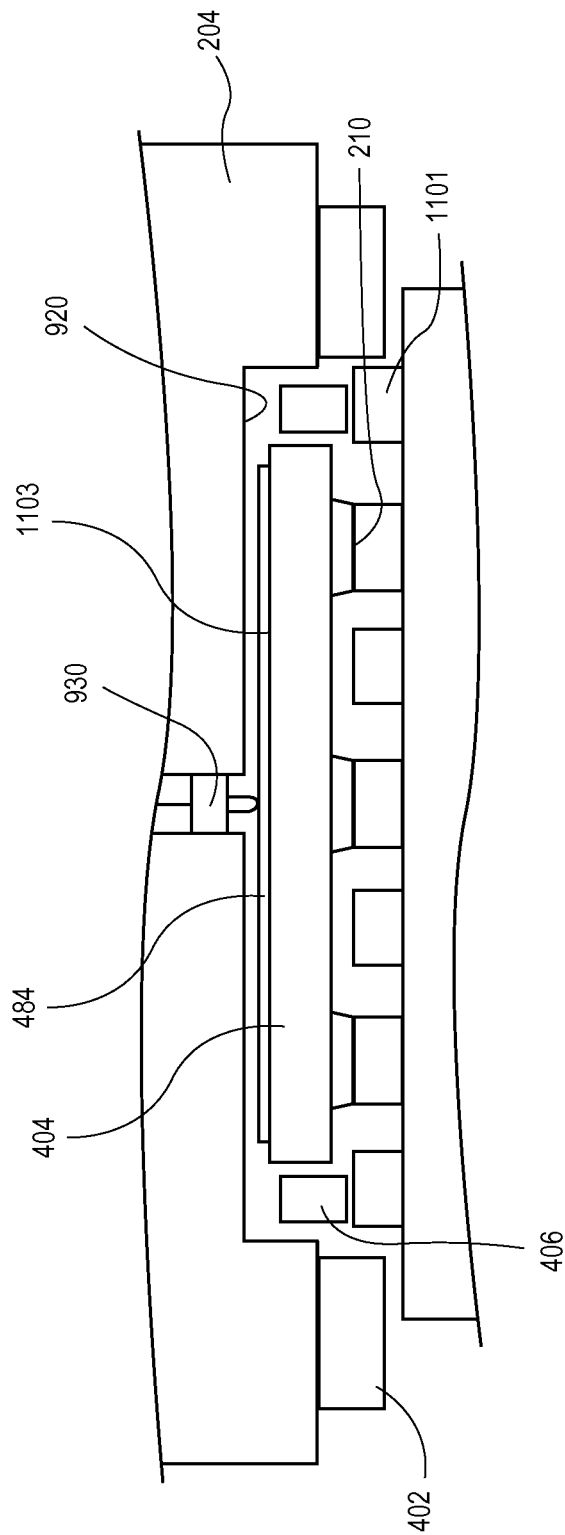
FIG. 11C is a cross-sectional side view illustration of a micro device transfer system having a pivot platform deflecting toward a transfer head assembly in accordance with an embodiment of the invention.

Referring again to FIG. 10, at operation 1010, pivot platform 404 of micro pick up array 202 deflects toward transfer head assembly 204 as the transfer head assembly 204 continues to move toward the carrier substrate. Referring to FIG. 11C, a cross-sectional side view illustration of a micro device transfer system having a pivot platform deflecting toward a transfer head assembly in accordance with an embodiment of the invention. As shown, the proximate surface 1103 of pivot platform 404 has contacted and depressed sensor(s) 930. Base 402 has remained in contact with mounting surface 208 of transfer head assembly 204. However, beam 406 has bent and/or twisted to enable pivot platform 404 to deflect toward sensor(s) 930.

Referring again to FIG. 10, at operation 1015, the deflection of pivot platform 404 is sensed. As shown in FIG. 11C, proximate surface 1103 of pivot platform 404 contacts and depresses sensor(s) 930. The depression of sensor(s) 930 may trigger a signal transmission to computer system 150, the signal indicating that pivot platform 404 has deflected. Sensor(s) 930 may detect a single location on pivot platform 404. Thus, in an embodiment, sensor(s) 930 indicate whether pivot platform 404 has deflected, but may not indicate whether the deflection is uniform across the entire pivot platform 404. However, in an embodiment with several sensors 930, additional information regarding the orientation of pivot platform 404 may be evaluated and supplied to computer system 150 to further control movement of mass transfer tool 100 and the micro device transfer system 200.

At operation 1020, relative movement between transfer head assembly 204 and carrier substrate 302 may be stopped. In an embodiment, as shown in FIG. 11C, pivot platform 404 has deflected with a proximate surface 1103 nearly parallel to recessed surface 920. However, in other embodiments, pivot platform 404 may be tilted relative to recessed surface 920. Relative movement between transfer head assembly 204 and carrier substrate 302 may be stopped immediately upon detecting deflection of pivot platform 404, or movement of transfer head assembly 204 can be continued after detection and prior to stopping the relative movement. For example, computer system 150 can control actuators of mass transfer tool 100 to cause movement of transfer head assembly 204 for a predetermined time or distance after detecting deflection. This additional range of motion following detection may ensure that complete contact is made between all, or almost all, of the electrostatic transfer heads 210 and micro devices 1101. Thus, detection of deflection can be an input in a chain of inputs that lead to halting movement of the transfer head assembly 204.

In accordance with embodiments of the invention, information obtained from the sensor(s) 930 can be used to operate the mass transfer tool 100 in a variety of fashions. In one embodiment, the mass transfer tool 100 may be operated in a drive to contact fashion in which the relative movement between the transfer head assembly 204 and carrier substrate 302 stops only when all sensors 930 have detected deflection. In another embodiment, relative movement is continued a set distance after a specific number of sensors 930 have detected deflection. By way of example, once a first sensor 930 or all of the sensors 930 have detected deflection, the relative movement may be continued for a set distance such as 10 nm to 1 µm. The set distance may vary based upon size of the micro devices, size of the electrostatic transfer heads, as well as the size and elastic modulus of the micro pick up array 202. In another embodiment, relative movement is stopped as soon as deflection is detected by any sensor 930. In yet another embodiment, upon detection of deflection of only a subset of the sensors 930, the transfer head assembly 204 may be actuated to further align the pivot platform 404 with the carrier substrate plane by tipping or tilting the transfer head assembly 204.

Still referring to FIG. 11C, the movement of transfer head assembly 204 may be stopped in a state where each electrostatic transfer head 210 is in contact with an apposing micro device 1101. In some embodiments or instances, this may not occur. However, in at least one embodiment, the deflection of pivot platform 404 facilitates this uniform contact to allow transferring an array of micro devices 1101 completely without damaging electrostatic transfer heads 210 or micro devices 1101.

Referring again to FIG. 10, at operation 1025, a voltage may be applied to the array of electrostatic transfer heads 210 to create a grip pressure on the corresponding array of micro devices 1101 on carrier substrate 302. As shown in FIG. 11C, with electrostatic transfer heads 210 placed in contact with micro devices 1101, an operating voltage may be applied to electrostatic transfer heads 210 through vias and traces of the micro pick up array 202. More specifically, voltage may be transmitted from operating voltage source 962, through the operating voltage source connection 960 of transfer head assembly 204, and into operating voltage source contact 418 before reaching electrostatic transfer heads 210. As a result, a gripping pressure is applied to the array of micro devices 1101 from the array of electrostatic transfer heads 210.

Figure 11D:
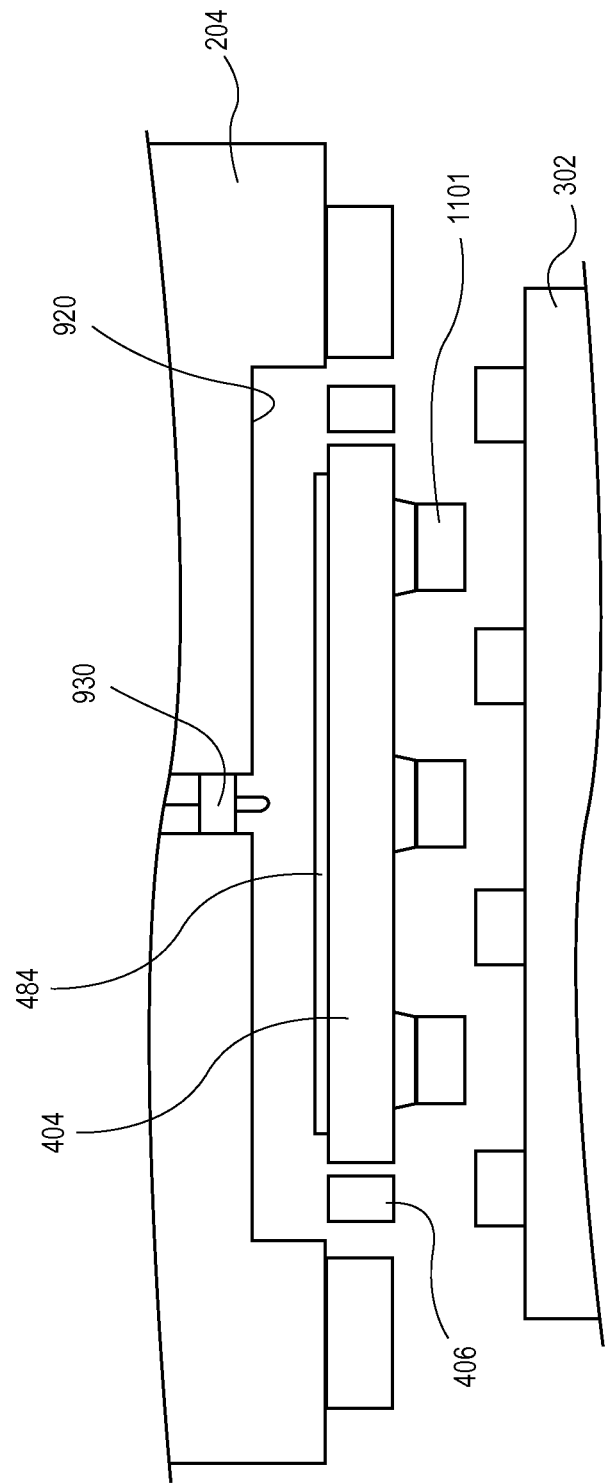
FIG. 11D is a cross-sectional side view illustration of a micro device transfer system having an array of electrostatic transfer heads picking up an array of micro devices from a carrier substrate in accordance with an embodiment of the invention.

Referring again to FIG. 10, at operation 1030, the array of micro devices is picked up from carrier substrate 302. Referring to FIG. 11D, a cross-sectional side view illustration of a micro device transfer system having an array of electrostatic transfer heads picking up an array of micro devices from a carrier substrate is shown in accordance with an embodiment of the invention. Actuators of mass transfer 100 may be controlled by computer system 150 to cause transfer head assembly 204 to retract from carrier substrate 302. During retraction, pivot platform 404 may return toward an undeflected state, as beams 406 release stored energy and spring back to an initial configuration. Simultaneously, sensor 930 may extend past recessed surface 920 to an initial configuration. During pick up, the electrostatic voltage supplied to electrostatic transfer heads 210 persists, and thus, micro devices 1101 are retained on electrostatic transfer heads 210 and removed from carrier substrate 302, once transfer head assembly 204 is sufficiently retracted.

During the pick up process described with respect to FIG. 10, heating element 484 on micro pick up array 202 may be heated. For example, heating element 484 can be resistively heated to transfer to micro devices in contact with electrostatic transfer heads 210 of micro pick up array 202. Heat transfer can occur before, during, and after picking up the array of micro devices from carrier substrate 302.

Following pick up of micro devices 1101 from carrier substrate 302, mass transfer tool 100 may be controlled by computer system 150 to move micro devices 1101 toward a receiving substrate in order to complete the transfer of the micro devices. For example, actuators and sensors of mass transfer tool 100 may be used to position transfer head assembly 204 over a receiving substrate held by a receiving substrate holder 106. After re-positioning the transfer head assembly 204 to prepare for transferring, the following process may be performed.

Figure 12:
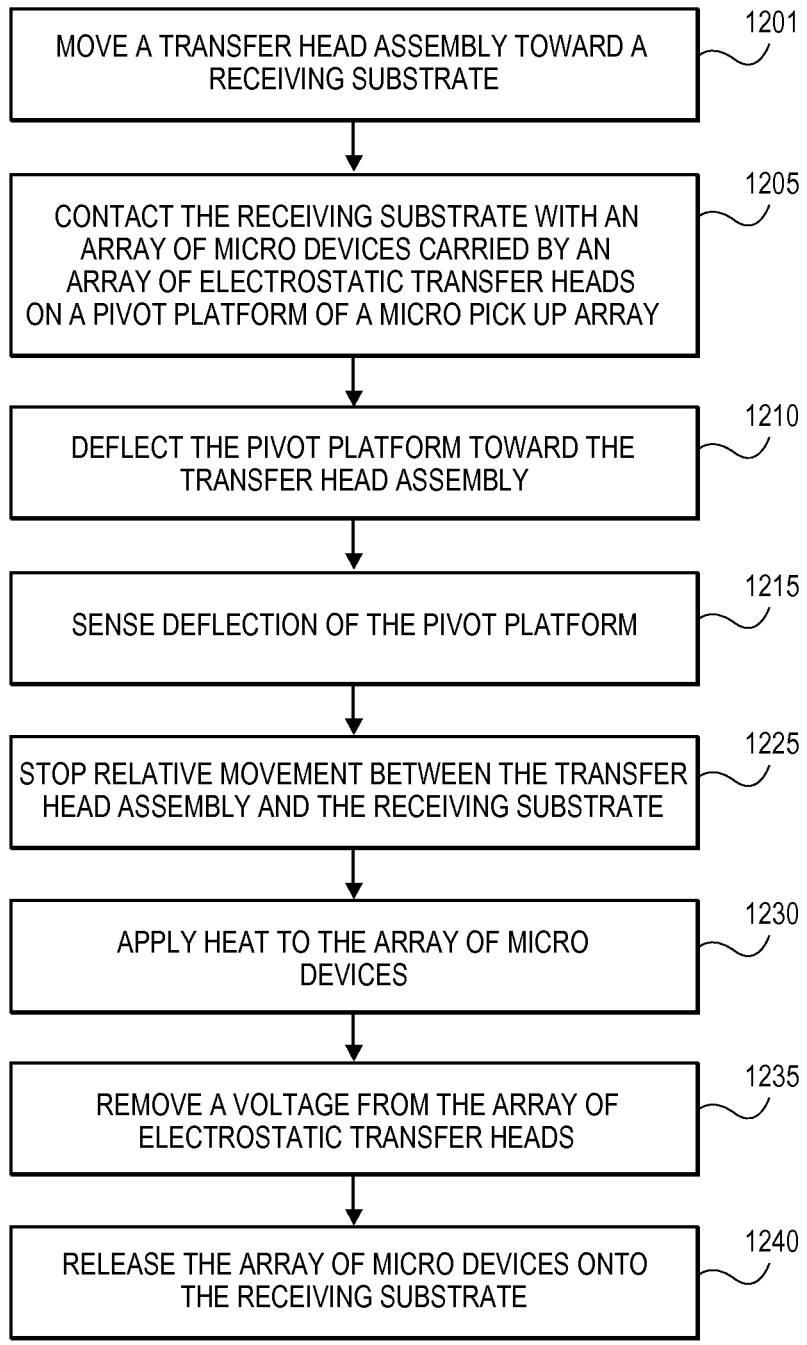
FIG. 12 is a flowchart illustrating a method of releasing an array of micro devices onto a receiving substrate in accordance with an embodiment of the invention.
Figure 13A:
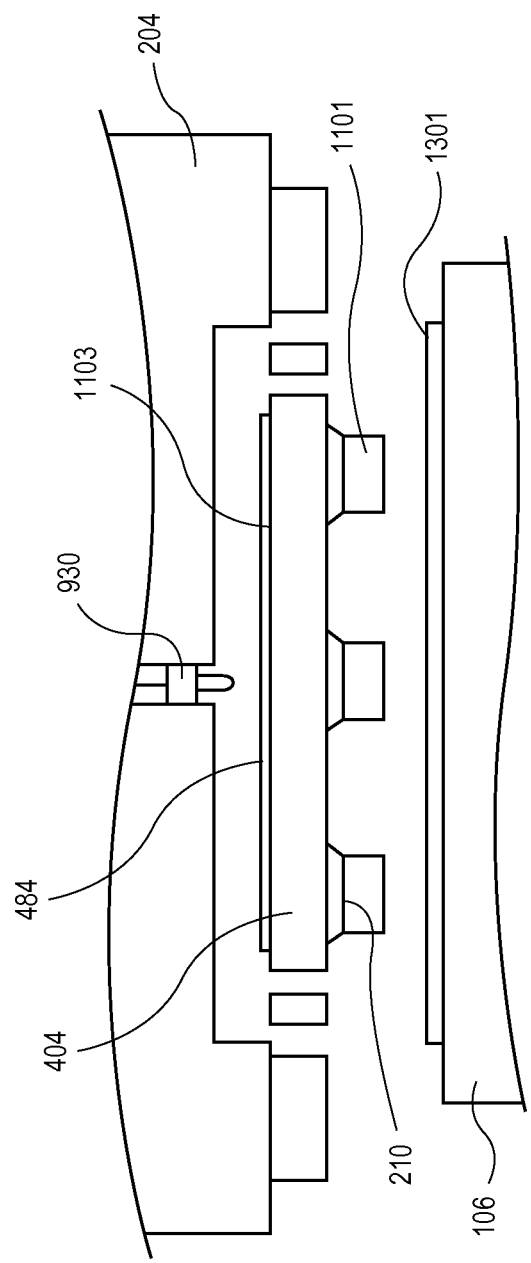
FIG. 13A is a cross-sectional side view illustration of a micro device transfer system having a transfer head assembly moving toward a receiving substrate in accordance with an embodiment of the invention.

Referring to FIG. 12, a flowchart illustrating a method of releasing an array of micro devices onto a receiving substrate is shown in accordance with an embodiment of the invention. For illustrational purposes, the following description of FIG. 12 is also made with reference to the embodiments illustrated in FIGS. 13A-13C. At operation 1201, transfer head assembly 204 is moved toward a receiving substrate 1301 on receiving substrate holder 106. Referring to FIG. 13A, a cross-sectional side view illustration of a micro device transfer system having a transfer head assembly moving toward a receiving substrate is shown in accordance with an embodiment of the invention. Pivot platform 404 may be undeflected, with a gap between proximate surface 1103 of pivot platform 404 and one or more sensors 930. The micro pick up array 202 may be mounted on transfer head assembly 204 in one of the manners described above. Furthermore, array of electrostatic transfer heads 210 grips array of micro devices 1101 with a gap between array of micro devices 1101 and receiving substrate 106. In this state, transfer head assembly 204 may be moved toward receiving substrate 1301 by mass transfer tool 100 under the control of computer system 150.

Figure 13B:
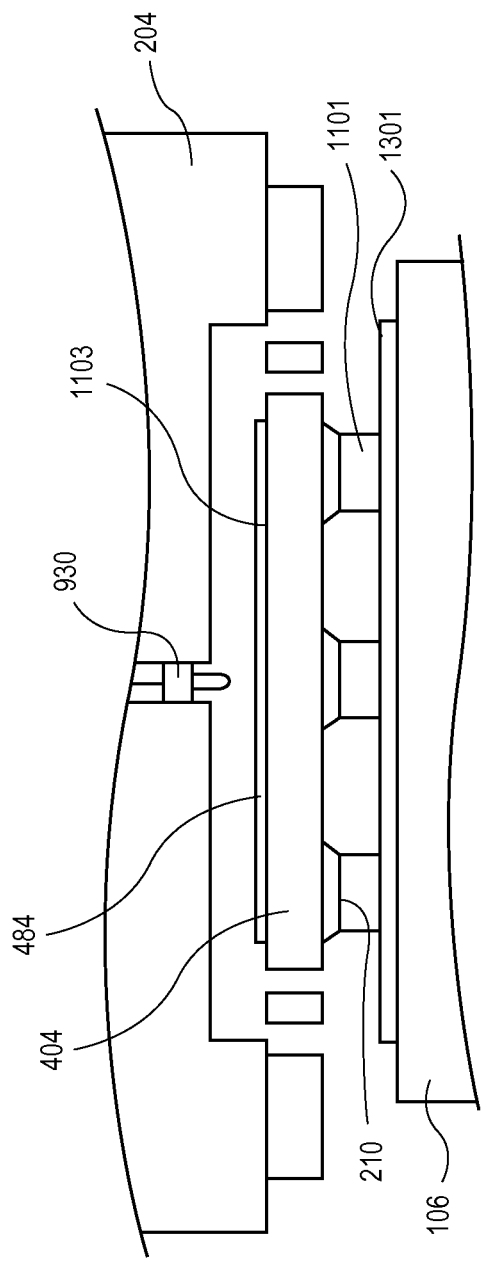
FIG. 13B is a cross-sectional side view illustration of a micro device transfer system having an array of electrostatic transfer heads carrying an array of micro devices contacting a receiving substrate in accordance with an embodiment of the invention.

Referring again to FIG. 12, at operation 1205, the array of micro devices 1101 carried by electrostatic transfer heads 210 contacts the receiving substrate 1301. Referring to FIG. 13B, a cross-sectional side view illustration of a micro device transfer system having an array of electrostatic transfer heads carrying an array of micro devices contacting a receiving substrate is shown in accordance with an embodiment of the invention. Transfer head assembly 204 has moved toward receiving substrate 1301 until the gap between the array of micro devices 1101 and receiving substrate 1301 has closed. However, pivot platform 404 remains undeflected, and therefore, the gap between sensor 930 and the proximate surface 1103 of pivot platform 404 remains unchanged from the state shown in FIG. 13A. Although shown in alignment, at this point one or more micro devices 1101 may not be in contact with receiving substrate 1301.

Figure 13C:
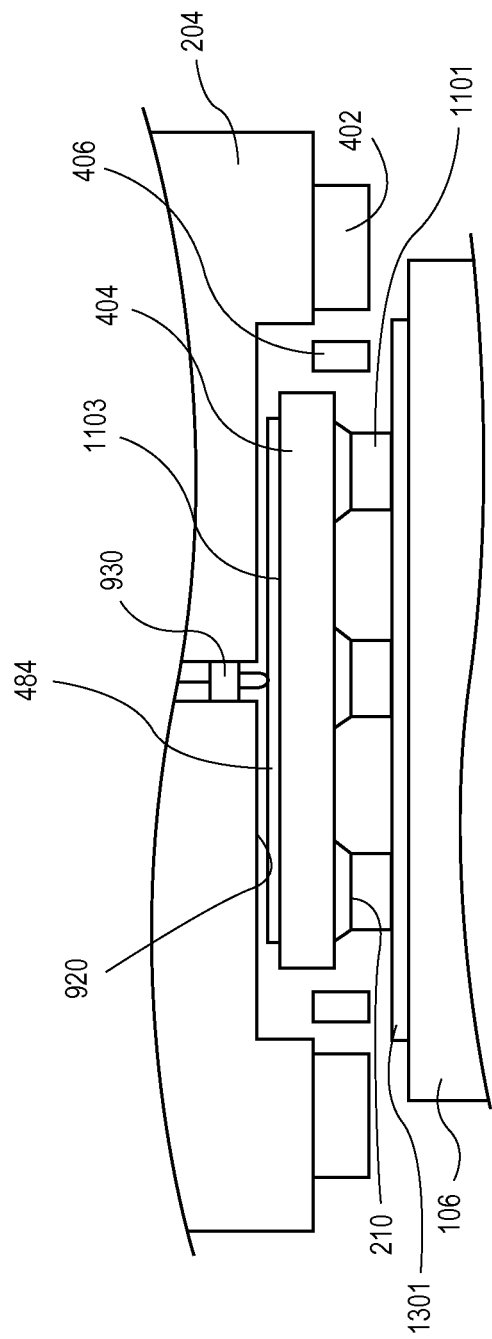
FIG. 13C is a cross-sectional side view illustration of a micro device transfer system having a pivot platform deflecting toward a transfer head assembly in accordance with an embodiment of the invention.

Referring again to FIG. 12, at operation 1210, pivot platform 404 of micro pick up array 202 deflects toward transfer head assembly 204 as the transfer head assembly 204 continues to move toward the receiving substrate 1301. Referring to FIG. 13C, a cross-sectional side view illustration of a micro device transfer system having a pivot platform deflecting toward a transfer head assembly is shown in accordance with an embodiment of the invention. Proximate surface 1103 of pivot platform 404 has contacted and depressed sensor(s) 930. Base 402 has remained in contact with mounting surface 208 of transfer head assembly 204. However, beam 406 has bent or twisted to deflect away from receiving substrate 1301 such that pivot platform 404 deflects toward sensor(s) 930.

Referring again to FIG. 12, at operation 1215, the deflection of pivot platform 404 may be sensed. As shown in FIG. 13C, sensor 930 is contacted and depressed by proximate surface 1103 of pivot platform 404. The depression of sensor 930 may trigger a signal transmission to computer system 150, the signal indicating that pivot platform 404 has deflected. Sensor 930 may detect a single location on pivot platform 404. Thus, in an embodiment, sensor 930 indicates whether pivot platform 404 has deflected, but may not indicate whether the deflection is uniform across the entire pivot platform 404. However, in an alternative embodiment, several sensors 930 may be used, and thus, additional information regarding the orientation of pivot platform 404 may be evaluated and supplied to computer system 150 to control movement of mass transfer tool 100 and the micro device transfer system 200.

In an embodiment, such as the one shown in FIG. 13C, pivot platform 404 has deflected with an upper surface 1103 nearly parallel to recessed surface 920. However, in other embodiments, pivot platform 404 may be tilted relative to recessed surface 920. Relative movement between transfer head assembly 204 and carrier substrate 302 may be stopped immediately upon detecting deflection of pivot platform 404, or movement of transfer head assembly 204 can be continued after detection. For example, computer system 150 can control mass transfer tool 100 to move transfer head assembly 204 for a predetermined time or distance after detecting deflection. This additional range of motion following detection may ensure that complete contact is made between all, or almost all, of the micro devices and the receiving substrate. Thus, detection of deflection can be an input in a chain of inputs that lead to halting movement of the transfer head assembly 204 at operation 1225.

In accordance with embodiments of the invention, information obtained from the sensor(s) 930 can be used to operate the mass transfer tool 100 in a variety of fashions. In one embodiment, the mass transfer tool 100 may be operated in a drive to contact fashion in which the relative movement between the transfer head assembly 204 and receiving substrate 1301 stops only when all sensors 930 have detected deflection. In another embodiment, relative movement is continued for a set distance after a specific number of sensors 930 have detected deflection. By way of example, once a first sensor 930 or all of the sensors 930 have detected deflection, the relative movement may be continued for a set distance such as 10 nm to 1 μm. The set distance may vary based upon size of the micro devices, electrostatic transfer heads, as well as the size and elastic modulus of the micro pick up array 202. In another embodiment, relative movement is stopped as soon as deflection is detected by any sensor 930. In yet another embodiment, upon detection of deflection of only a subset of the sensors 930, the transfer head assembly 204 may be actuated to further align the pivot platform 404 with the receiving substrate plane by tipping or tilting the transfer head assembly 204 or receiving substrate 1301.

Referring again to FIG. 12, at operation 1230, heat may be applied to the array of micro devices. For example, heating element 484 may be resistively heated as described above to transfer heat through micro pick up array 202 into the array of electrostatic transfer heads 210 that appose micro devices 1101. Micro devices 1101 may be heated throughout the placement process described with respect to FIG. 12. Maintaining an elevated temperature of micro pick up array 202 in this manner can avoid some problems that arise from temperature variations in an operating environment. However, more particularly, micro devices 1101 may be heated after deflection of pivot platform 404 is sensed and/or after micro devices 1101 are in contact with receiving substrate 1301. In an embodiment, each electrostatic transfer head 210 in the array is heated uniformly, e.g., to a temperature of 50 degrees Celsius, 180 degrees Celsius, 200 degrees Celsius, or even up to 350 degrees Celsius. These temperatures can cause melting or diffusion between micro devices 1101 and receiving substrate 1301.

Referring again to FIG. 12, at operation 1235, the voltage may be removed from the array of electrostatic transfer heads 210. As shown in FIG. 13C, with micro devices 1101 in contact with receiving substrate 1301, the electrostatic voltage may be removed from electrostatic transfer heads 210. For example, the electrostatic voltage that was applied to electrostatic transfer heads 210 through vias and traces of the micro pick up array 202 may be discontinued or removed.

Figure 13D:
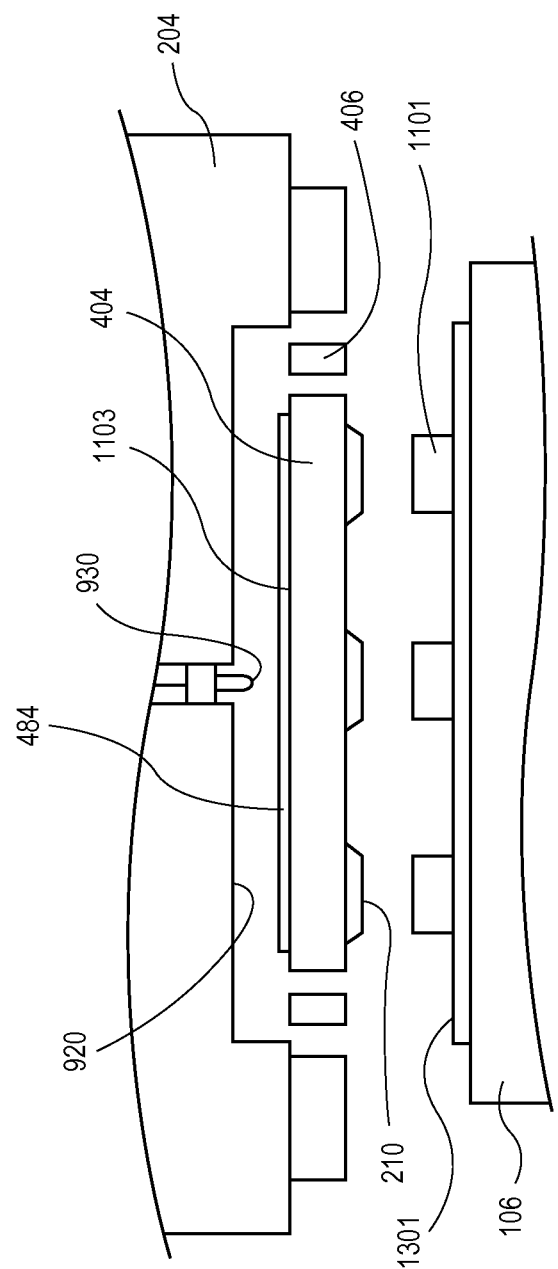
FIG. 13D is a cross-sectional side view illustration of a micro device transfer system releasing an array of micro devices onto a receiving substrate from an array of electrostatic transfer heads in accordance with an embodiment of the invention.

Referring again to FIG. 12, at operation 1240, the array of micro devices may be released onto the receiving substrate. Referring to FIG. 13D, a cross-sectional side view illustration of a micro device transfer system releasing an array of micro devices onto a receiving substrate from an array of electrostatic transfer heads in accordance with an embodiment of the invention. After electrostatic voltage is removed from electrostatic transfer heads 210, the grip pressure between electrostatic transfer heads 210 and micro devices 1101 is attenuated, and thus micro devices 1101 may release onto an adjacent surface of receiving substrate 1301. Following release of micro devices 1101, mass transfer tool 100 may be controlled to retract transfer head assembly 204 from receiving substrate 1301. During retraction, pivot platform 404 may return toward an undeflected state, as beams 406 spring back to an initial configuration. Simultaneously, sensor 930 may extend past recessed surface 920 to an initial configuration.

Transfer head assembly 204 may continue to lift away from receiving substrate 1301. Thus, a gap will occur between electrostatic transfer heads 210 and micro devices 1101, as micro devices 1101 are released onto receiving substrate 1301. Subsequently, transfer head assembly 204 may be moved back toward carrier substrate 302 to continue the transfer process by transferring another array of micro devices 1101, as described above.

Figure 14:
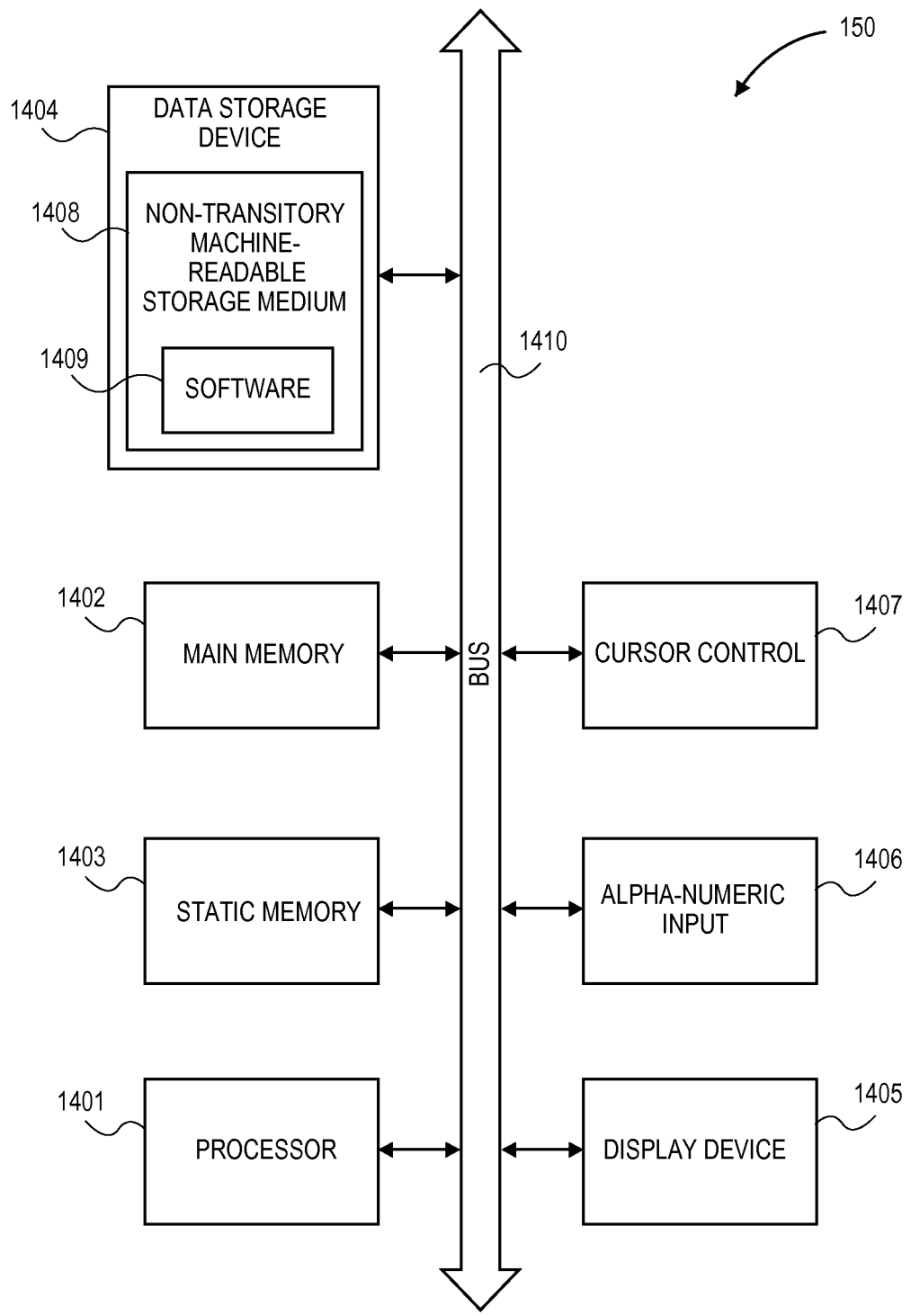
FIG. 14 is a schematic illustration of an exemplary computer system that may be used in accordance with an embodiment of the invention.

Referring to FIG. 14, a schematic illustration of an exemplary computer system that may be used is shown in accordance with an embodiment of the invention. Portions of embodiments of the invention are comprised of or controlled by non-transitory machine-readable and machine-executable instructions which reside, for example, in machine-usable media of a computer system 150. Computer system 150 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like.

Computer system 150 of FIG. 14 includes an address/data bus 1410 for communicating information, and a central processor unit 1401 coupled to bus 1410 for processing information and instructions. Computer system 150 also includes data storage features such as a computer usable volatile memory 1402, e.g. random access memory (RAM), coupled to bus 1410 for storing information and instructions for central processor unit 1401, computer usable non-volatile memory 1403, e.g. read only memory (ROM), coupled to bus 1410 for storing static information and instructions for the central processor unit 1401, and a data storage device 1404 (e.g., a magnetic or optical disk and disk drive) coupled to bus 1410 for storing information and instructions. Computer system 150 of the present embodiment also includes an optional alphanumeric input device 1406 including alphanumeric and function keys coupled to bus 1410 for communicating information and command selections to central processor unit 1401. Computer system 150 also optionally includes an optional cursor control device 1407 coupled to bus 1410 for communicating user input information and command selections to central processor unit 1401. Computer system 150 of the present embodiment also includes an optional display device 1405 coupled to bus 1410 for displaying information.

The data storage device 1404 may include a non-transitory machine-readable storage medium 1408 on which is stored one or more sets of instructions (e.g. software 1409) embodying any one or more of the methodologies or operations described herein. Software 1409 may also reside, completely or at least partially, within the volatile memory 1402, non-volatile memory 1403, and/or within processor 1401 during execution thereof by the computer system 150, the volatile memory 1402, non-volatile memory 1403, and processor 1401 also constituting non-transitory machine-readable storage media.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A micro pick up array to pick up an array of micro devices, the micro pick up array comprising:
    a substrate including a base, a pivot platform having a platform surface, and a beam, wherein the base is laterally around the pivot platform, wherein the beam is between the pivot platform and the base, wherein the beam is coupled with the pivot platform at an inner pivot and coupled with the base at an outer pivot, wherein the outer pivot is on a base edge and the inner pivot is on a pivot platform edge, wherein the base edge is orthogonal to the pivot platform edge, and wherein the beam is laterally around the pivot platform and coupled with the pivot platform at a second inner pivot and coupled with the base at a second outer pivot; and
    an array of electrostatic transfer heads supported by the platform surface of the pivot platform.

2. The micro pick up array of claim 1, wherein the inner pivot is across the pivot platform from the second inner pivot, and wherein the outer pivot is across the pivot platform from the second outer pivot.

3. The micro pick up array of claim 1, wherein the inner pivot and outer pivot comprise silicon.

4. The micro pick up array of claim 1, wherein each electrostatic transfer head includes a top surface having a surface area in a range of 1 to 10,000 square micrometers.

5. The micro pick up array of claim 1 further comprising an operating voltage source contact on the base, the operating voltage source contact in electrical connection with the array of electrostatic transfer heads.

6. The micro pick up array of claim 5 further comprising a trace, wherein the operating voltage source contact is in electrical connection with the array of electrostatic transfer heads through the trace.

7. The micro pick up array of claim 6, wherein the trace runs over the beam and further comprising a dummy trace running over the beam across the pivot platform from the trace.

8. A micro pick up array to pick up an array of micro devices, the micro pick up array comprising:
    a substrate including a base, a pivot platform having a platform surface, and a beam, wherein the base is laterally around the pivot platform, wherein the beam is between the pivot platform and the base, and wherein the beam is coupled with the pivot platform at an inner pivot and coupled with the base at an outer pivot;
an array of electrostatic transfer heads supported by the platform surface of the pivot platform;
a heating contact on the base; and
a heating element over the pivot platform in electrical connection with the heating contact.

9. The micro pick up array of claim 8 further comprising a temperature sensor on the pivot platform.

10. The micro pick up array of claim 8, wherein the heating element is on the pivot platform.

11. The micro pick up array of claim 8, wherein the outer pivot is on a base edge and the inner pivot is on a pivot platform edge, and wherein the base edge is orthogonal to the pivot platform edge.

12. The micro pick up array of claim 11 further comprising a second beam coupled with the base by a second outer pivot on a second base edge and coupled with the pivot platform by a second inner pivot on a second pivot platform edge.

13. The micro pick up array of claim 11, wherein the beam is laterally around the pivot platform and coupled with the pivot platform at a second inner pivot and coupled with the base at a second outer pivot.

14. The micro pick up array of claim 13, wherein the inner pivot is across the pivot platform from the second inner pivot, and wherein the outer pivot is across the pivot platform from the second outer pivot.

15. The micro pick up array of claim 8, wherein the inner pivot and outer pivot comprise silicon.

16. The micro pick up array of claim 8, wherein each electrostatic transfer head includes a top surface having a surface area in a range of 1 to 10,000 square micrometers.

17. The micro pick up array of claim 8 further comprising an operating voltage source contact on the base, the operating voltage source contact in electrical connection with the array of electrostatic transfer heads.

18. The micro pick up array of claim 17 further comprising a trace, wherein the operating voltage source contact is in electrical connection with the array of electrostatic transfer heads through the trace.

19. The micro pick up array of claim 18, wherein the trace runs over the beam and further comprising a dummy trace running over the beam across the pivot platform from the trace.

\* \* \* \* \*